United States Patent
Kurita et al.

(10) Patent No.: US 9,949,418 B2
(45) Date of Patent: Apr. 17, 2018

(54) ELECTRONIC COMPONENT MOUNTING APPARATUS AND ELECTRONIC COMPONENT MOUNTING METHOD

(71) Applicant: JUKI CORPORATION, Tama-shi, Tokyo (JP)

(72) Inventors: Naoki Kurita, Tama (JP); Takahiro Oohashi, Tama (JP); Takahiko Imasu, Tama (JP); Kouei Kobayashi, Tama (JP); Yasuaki Sakata, Tama (JP)

(73) Assignee: JUKI CORPORATION, Tama-shi, Tokyo (JP)

( * ) Notice: Subject to any disclaimer, the term of this patent is extended or adjusted under 35 U.S.C. 154(b) by 268 days.

(21) Appl. No.: 14/630,986

(22) Filed: Feb. 25, 2015

(65) Prior Publication Data

US 2015/0245549 A1    Aug. 27, 2015

(30) Foreign Application Priority Data

Feb. 26, 2014  (JP) ................................. 2014-035935

(51) Int. Cl.
*B23K 3/00* (2006.01)
*H05K 13/02* (2006.01)
(Continued)

(52) U.S. Cl.
CPC ............ *H05K 13/022* (2013.01); *B23K 3/082* (2013.01); *B23K 31/12* (2013.01); *B23K 37/04* (2013.01);
(Continued)

(58) Field of Classification Search
CPC .......... H01L 21/67144; H05K 13/0413; H05K 13/08; H05K 13/046
(Continued)

(56) References Cited

U.S. PATENT DOCUMENTS

2002/0039437 A1* 4/2002 Sugawara ............. G06T 7/0002
  382/151
2003/0110610 A1   6/2003 Duquette et al.
(Continued)

FOREIGN PATENT DOCUMENTS

EP          2528425 A2     11/2012
JP       A-H05-251897       9/1993
(Continued)

OTHER PUBLICATIONS

Extended European Search Report dated Jun. 30, 2015 from corresponding European Patent Application No. 15156464.8 (9 pages).
(Continued)

*Primary Examiner* — Erin B Saad
(74) *Attorney, Agent, or Firm* — Drinker Biddle & Reath LLP

(57) ABSTRACT

An electronic component mounting apparatus includes an electronic component supply device for supplying an electronic component, a head including a head main body and a head camera unit, and a control device. The head main body includes nozzles, a nozzle drive unit for driving the nozzles and a head support body for supporting the nozzles and the nozzle drive unit. The head camera unit is fixed to the head support body and has head cameras corresponding to the nozzles respectively for photographing electronic components. The head drives the nozzles to hold the electronic components, transfers the electronic components from the electronic component supply device to the substrate and mounts the electronic components onto the substrate. The control device synthesizes images photographed by the head cameras to generate an image with fields of the head cameras connected together, and determines a process based on the synthesized image synthesized.

8 Claims, 14 Drawing Sheets

(51) Int. Cl.
  *H05K 3/32* (2006.01)
  *H05K 3/30* (2006.01)
  *H05K 13/04* (2006.01)
  *H05K 13/08* (2006.01)
  *B23K 3/08* (2006.01)
  *B23K 37/04* (2006.01)
  *B23K 31/12* (2006.01)

(52) U.S. Cl.
  CPC .............. *H05K 3/303* (2013.01); *H05K 3/32* (2013.01); *H05K 13/046* (2013.01); *H05K 13/08* (2013.01); *H05K 2203/15* (2013.01); *H05K 2203/163* (2013.01); *H05K 2203/166* (2013.01); *H05K 2203/30* (2013.01)

(58) Field of Classification Search
  USPC ................. 29/743, 740; 228/8; 257/E21.499
  See application file for complete search history.

(56) References Cited

U.S. PATENT DOCUMENTS

| | | |
|---|---|---|
| 2003/0133603 A1 | 7/2003 | Mitsumoto et al. |
| 2003/0177633 A1* | 9/2003 | Haji ................. H01L 21/67144 29/743 |
| 2007/0116351 A1 | 5/2007 | Duquette et al. |
| 2007/0116352 A1 | 5/2007 | Duquette et al. |
| 2007/0120977 A1 | 5/2007 | Duquette et al. |
| 2010/0295935 A1 | 11/2010 | Case et al. |
| 2011/0069154 A1 | 3/2011 | Case et al. |
| 2011/0175997 A1 | 7/2011 | Case et al. |
| 2012/0233852 A1 | 9/2012 | Abe et al. |
| 2013/0008019 A1 | 1/2013 | Abe |

FOREIGN PATENT DOCUMENTS

| | | |
|---|---|---|
| JP | A-2005-101083 | 4/2005 |
| JP | 4201711 B2 | 12/2008 |
| JP | A-2010-114338 | 5/2010 |
| JP | A-2010-261955 | 11/2010 |
| JP | 3165153 U | 1/2011 |
| JP | A-2012-164908 | 8/2012 |
| JP | A-2012-248626 | 12/2012 |

OTHER PUBLICATIONS

Japanese Office Action dated Jan. 9, 2018 in Japanese application No. 2014-035935 (with English-language translation).

* cited by examiner

ELECTRONIC COMPONENT MOUNTING APPARATUS AND ELECTRONIC COMPONENT MOUNTING METHOD

CROSS-REFERENCE TO RELATED APPLICATIONS

This application is based upon and claims the benefit of priority from Japanese Patent Application No. 2014-035935, filed on Feb. 26, 2014; the entire contents of which are incorporated herein by reference.

BACKGROUND OF INVENTION

Field of the Invention

The invention relates to apparatus and method for mounting an electronic component onto a substrate.

Related Art

An electronic component mounting apparatus repeats an operation to hold an electronic component using a nozzle provided on a head and mount it onto a mounting point provided at a substrate to thereby mount electronic components onto the substrate. Some of this type electronic component mounting apparatus includes an imaging device for photographing an area to be checked in order to check and observe the state of the substrate and the state of electronic components to be mounted. For example, JP-U-3165153 discloses a camera used to check whether a bad mark provided on the substrate is present or absent. Also, JP-B-4201711 discloses multiple cameras which are arranged directed from different directions toward electronic components mounting positions and are used to photograph images before and behind electronic components mounting points.

SUMMARY OF INVENTION

In the electronic component mounting apparatus, by photographing images using cameras, various checks and observations can be performed, thereby prevent manufacture of a defective substrate. However, in order to photograph the images of a substrate and electronic parts being sucked by cameras not provided on a head, another camera moving mechanism is necessary, resulting in the complicated structure. Also, after photographed by the cameras, the images must be processed and the head must be moved, which increases the time necessary for production.

The invention aims at solving the above problems and thus has an object to provide apparatus and method for mounting electronic components which can process images efficiently and can mount electronic components in a shorter time to thereby realize enhanced productivity.

An electronic component mounting apparatus includes a substrate transfer unit, an electronic component supply device, a head, a head moving mechanism and a control device. The substrate transfer unit transfers a substrate. The electronic component supply device supplies an electronic component. The head includes a head main body and a head camera unit. The head main body includes a plurality of nozzles, a nozzle drive unit and a head support body. The plurality of nozzles hold electronic components. The nozzle drive unit drives the nozzles. The head support body supports the nozzles and the nozzle drive unit. The head camera unit is fixed to the head support body and has a plurality of head cameras corresponding to the nozzles respectively for photographing electronic components held by the corresponding nozzles or electronic components to be held by the corresponding nozzles. The head drives the nozzles to hold the electronic components, transfers the electronic components from the electronic component supply device to the substrate and mounts the electronic components onto the substrate. The head moving mechanism moves the head. The control device includes a camera control unit which processes images photographed by the head cameras and a head control unit which controls an operation of the head. The camera control unit synthesizes the images photographed by the head cameras to generate an image with (continuous) fields of the head cameras connected together. The control device determines a process based on the image synthesized by the camera control unit.

Additionally, the control device drives the head camera unit to photograph a range including a bad mark forming position of the substrate. The control device checks whether a bad mark is present or not based on the synthesized image.

Additionally, the control device controls a mounting of the electronic component based on a mounting point of the electronic component included in the synthesized image.

Additionally, the control device drives the head camera unit to photograph a range including the mounting point where the electronic component is mounted. The control device compares images photographed before and after the electronic component is mounted and, controls an electronic component mounting operation based on a comparison result.

Additionally, the control device drives the head camera unit to photograph the electronic component supply device. The control device detects a hold position for holding the electronic component based on the synthesized image.

Additionally, the electronic component mounting apparatus further includes a fluxer application device. The fluxer application device has a fluxer storage unit which stores a fluxer therein and applies the fluxer to the electronic component by using the nozzle so as to have a contact between the electronic component and the fluxer. The control device drives the head camera unit to photograph a liquid surface of the fluxer stored in the fluxer storage unit. The control device controls an operation to apply the fluxer to the electronic component based on the synthesized image.

Additionally, the control device detects the liquid surface of the fluxer based on the synthesized image to determine a position of the fluxer liquid surface with which the electronic component is to be contacted.

Additionally, the control device detects the liquid surface of the fluxer based on the synthesized image. When the liquid surface has no area capable of applying the fluxer to the electronic component, the control device stops the operation to apply the fluxer to the electronic component.

Additionally, the control device drives the head camera unit to photograph the liquid surface of the fluxer stored in the fluxer storage unit before and after the fluxer is applied to the electronic component. The control device checks the liquid surface of the fluxer based on the synthesized image and determines an applied state of the fluxer to the electronic component based on a change of the liquid surface of the fluxer.

An electronic component mounting method uses an electronic component mounting apparatus. The electronic component mounting apparatus includes a head moving mechanism and a head including a head main body and a head camera unit. The head main body has a plurality of nozzles for holding electronic components, a nozzle drive unit for driving the nozzles and a head support body for supporting the nozzles and the nozzle drive unit. The head camera unit is fixed to the head support body and has a plurality of head cameras corresponding to the nozzles respectively for photographing electronic components held by the corresponding nozzles or electronic components to be held by the corresponding nozzles. The head drives the nozzle to hold the electronic components, transfers the electronic components from an electronic component supply device to a substrate and mounts the electronic components onto the substrate. The head moving mechanism moves the head. The electronic component mounting apparatus mounts the electronic components onto the substrate. The electronic component mounting method including: synthesizing images photographed by the head cameras to generate an image with fields of the head cameras connected together; and determining a process based on the synthesized image.

Additionally, the electronic component mounting apparatus further includes a fluxer application device. The fluxer application device has a fluxer storage unit for storing a fluxer therein and applies the fluxer to the electronic component by using the nozzle so as to have a contact between the electronic component and the fluxer. The electronic component mounting method further including: driving the head camera unit to photograph a liquid surface of the fluxer stored in the fluxer storage unit before and after the fluxer is applied to the electronic component; and checking an applied state of the fluxer to the electronic component based on a change of the liquid surface of the fluxer.

The invention provides an effect that images can be processed efficiently, electronic components can be mounted in shorter time and productivity can be enhanced.

DETAILED DESCRIPTION

Description is given below specifically of the invention with reference to the drawings. Here, the invention is not limited to the mode for carrying out the invention (which is hereinafter called an embodiment). Also, the composing elements of the embodiment contain elements easily assumable by persons skilled in the art, the substantially same elements and the elements that fall within a so-called equivalent range. Further, the composing elements disclosed in the following embodiment can be combined properly.

Description is given below specifically of the embodiment of the electronic component mounting apparatus of the invention with reference to the drawings. Here, the invention is not limited to this embodiment. This embodiment provides an electronic component mounting apparatus which includes a lead wire (insertion part) and is capable of mounting an electronic component, namely, a so-called insertion type electronic component to be mounted onto a substrate by inserting the lead wire into a substrate hole (insertion hole, hole) formed in the substrate, and a placement type electronic component to be placed onto the substrate with no insertion into the insertion hole (substrate hole). Here, the insertion type electronic component is the part that is mounted by inserting the lead wire into the hole of the substrate, while an electronic component to be placed onto the substrate without being inserted into the insertion hole (substrate hole), for example, SOP or QFP is called a placement type electronic component. Here, the electronic component mounting apparatus may have a function to mount only the placement type electronic component placed on the substrate, or may have a function to mount only the insertion type electronic component (lead type electronic component).

Next, description is given of an electronic component mounting apparatus 10 of this embodiment. The electronic component mounting apparatus 10 is an apparatus which can mount both the placement type electronic component to be mounted by placing it onto the substrate and the insertion type electronic component (lead type electronic component) to be mounted by inserting the lead wire into the insertion hole of the substrate. The electronic component mounting apparatus 10 can mount both the placement type electronic component and insertion type electronic component, or can mount only any one of them. That is, the electronic component mounting apparatus 10 can mount both the placement type electronic component and insertion type electronic component and thus can be applied to various uses according to a substrate to be manufactured or the layout of another electronic mounting apparatus.

Figure 1:
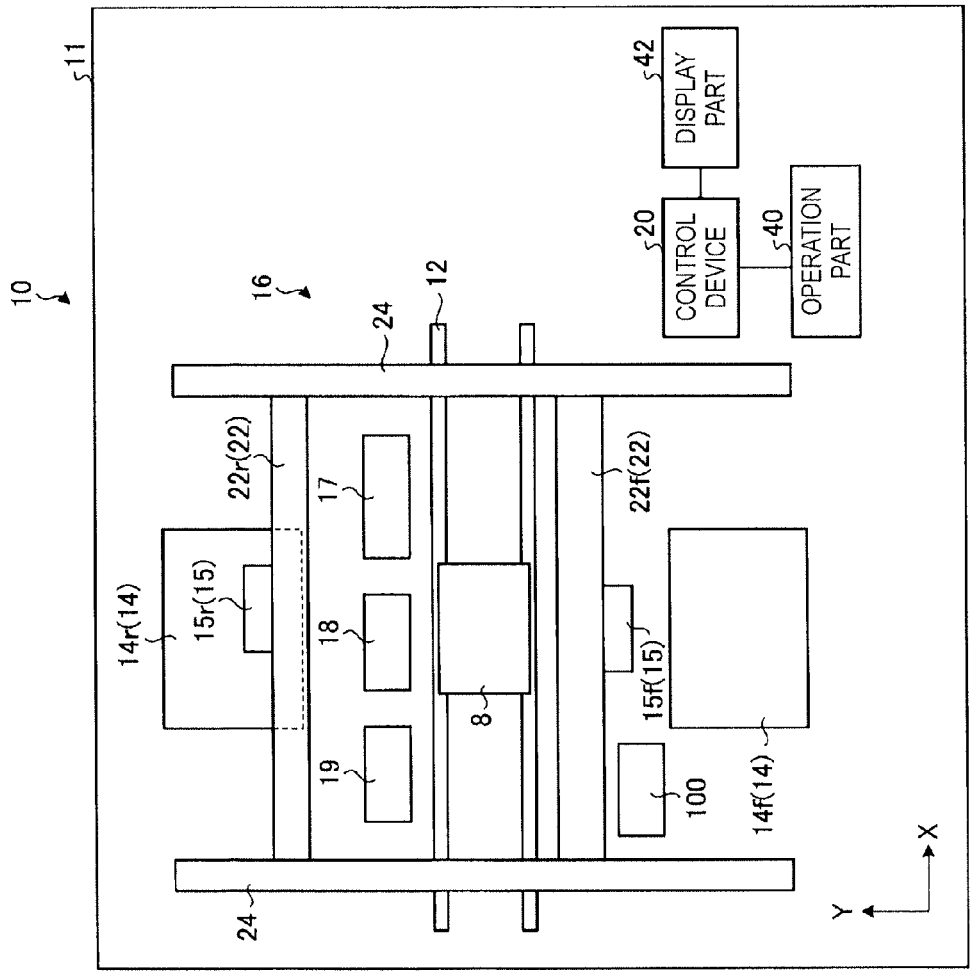
FIG. 1 is a diagram of the schematic structure of an electronic component mounting apparatus.

FIG. 1 is a diagram of the schematic structure of the electronic component mounting apparatus 10. This is an apparatus for placing an electronic component onto a substrate 8. The apparatus 10 includes a box body 11, a substrate transfer part 12, component supply units 14f, 14r, heads 15f, 15r, an XY moving mechanism 16, a VCS unit 17, a substitution nozzle hold mechanism 18, a component storage part 19, a control device 20, an operation part 40, a display part 42 and a fluxer application device 100. The XY moving mechanism 16 includes X axis drive parts 22f, 22r, and a Y axis drive part 24. Here, the apparatus 10 of this embodiment, as shown in FIG. 1, includes the component supply units 14f, 14r, heads 15f, 15r and X axis drive parts 22f, 22r on its front and rear sides across the substrate transfer part 12. The component supply unit 14f, head 15f and X axis drive part 22f are disposed on the front side of the apparatus 10, whereas the component supply unit 14r, head 15r and X axis drive part 22r are disposed on the rear side. Also, in the following description, in the case that the two component supply units 14f, 14r, two heads 15f, 15r and tow X axis drive parts 22f, 22r are not specifically distinguished from each other, they are described as the component supply unit 14, head 15 and X axis drive part 22.

The substrate 8 may be a member capable of mounting an electronic component thereon and its structure is not limited specifically. The substrate 8 of this embodiment is a plate-shaped member with a wiring pattern arranged on its surface. To the wiring pattern surface of the substrate 8, there is attached a solder serving as a joining member for joining the wiring pattern of the plate-shaped member to an electronic component by reflow. The substrate 8 also has a through hole (insertion hole, substrate hole) into which the electronic component is to be inserted.

The substrate transfer part 12 is a transfer mechanism for transferring the substrate 8 in the X axis direction in FIG. 1. This part 12 includes a rail extending in the X axis direction and a transfer mechanism for supporting and moving the substrate 8 along the rail. With the mounting surface of the substrate 8 facing the head 15, it moves the substrate 8 along the rail using the transfer mechanism to thereby transfer the substrate 8 in the X axis direction. On receiving the substrate 8 from a device for supplying it to the electronic component mounting apparatus 10, it transfers the substrate 8 up to a specific position on the rail. The head 15 mounts an electronic component onto the surface of the substrate 8 at a specific potion. When an electronic component is mounted on the substrate 8 transferred to the specific position, the part 12 transfers the substrate 8 to a device for performing the next step. Here, the transfer mechanism of the part 12 can have various structures. For example, a rail arranged along the transfer direction of the substrate 8 and an endless belt rotating along the rail may be combined together and the substrate 8 may be transferred while it is mounted on the endless belt. This is an integrated belt type transfer mechanism.

In the apparatus 10, the component supply unit 14*f* is arranged on the front side, while the unit 14*r* is arranged on the rear side. The front- and rear-side units 14*f* and 14*r* respectively hold a large number of electronic components mounted on the substrate 8 and are able to supply them to the head 15. That is, the apparatus 10 includes an electronic component supply device for supplying electronic components to a hold position in a state where they can be held (absorbed or gripped) by the head 15. The units 14*f* and 14*r* of this embodiment both supply lead type electronic components each having a main body and a lead connected to the main body.

Figure 2:
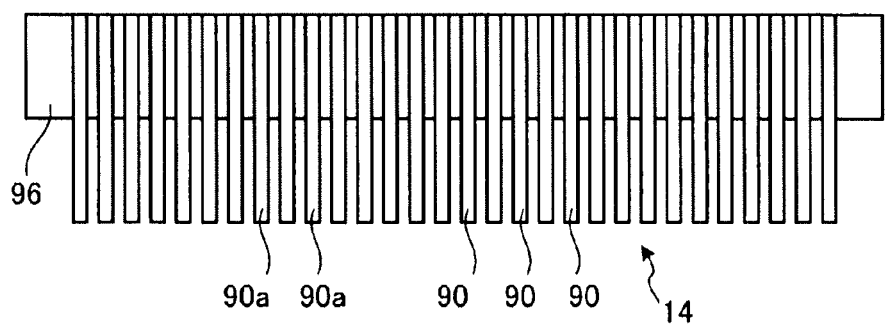
FIG. 2 is a diagram of the schematic structure of an example of a component supply unit.

FIG. 2 is a diagram of the schematic structure of an example of the component supply unit. The component supply unit 14, as shown in FIG. 2, includes multiple electronic component supply devices (which is also hereinafter called [component supply devices] simply) 90, 90*a*.

Specifically, the unit 14 mounts therein electronic component hold tape (radial component tape) having fixed multiple radial-lead type electronic components (radial lead parts) to the tape main body. The lead of the radial-lead type electronic component held by the electronic component hold tape is cut at a hold position (a second hold position), whereby it can be held by a suction nozzle or by a grip nozzle provided on the head.

The unit 14 also mounts therein electronic component hold tape (chip component tape) having fixed multiple placement type electronic components to the tape main body. Each placement type electronic component held by the electronic component hold tape is peeled from the tape main body at its hold position (a first hold position), whereby it can be held by a suction nozzle or by a grip nozzle provided on the head.

The unit 14 may further include, on its rear side bank, a stick feeder or a tray feeder serving as the electronic component supply device 90*a*. The multiple component supply devices 90, 90*a* shown in FIG. 2 are held by a support base (bank) 96. The support base 96 can also mount thereon other devices (for example, measuring devices and cameras) than the devices 90, 90*a*.

The unit 14 is constituted of the multiple electronic component supply devices 90, 90*a* held by the support base 96. The devices 90, 90*a* are different in their mechanisms for holding and supplying electronic components depending on the kinds of electronic components to be mounted. Also, the unit 14 may also include multiple devices 90, 90*a* of the same kind. The unit 14 may preferably be structured such that it can be removably mounted onto the apparatus main body.

The device 90, using electronic component hold tape with the leads of multiple radial-lead type electronic components attached thereto, supplies radial-lead type electronic components to the head 15. Also, the device 90 is a tape feeder which holds the electronic component hold tape, feeds the hold tape held thereby, and moves the radial-lead type electronic components held thereby to the hold area (suction position, grip position, hold position) where the electronic components can be held by the nozzles of the head 15. Further, the device 90, by cutting and separating the leads of the radial-lead type electronic components moved to the hold area, enables holding of the radial-lead type electronic components with the leads thereof fixed by the tape at specific positions. Thus, the radial-lead type electronic components can be held (sucked, gripped) by the nozzles of the head 15.

Here, the multiple component supply devices 90 may respectively supply different kinds of electronic components or individual electronic components. Also, the device 90 is not limited to the device that supplies multiple radial-lead electronic components stored in the storage chamber of the tape, but there can also be used a circular-shaped bowl feeder (which supplies components by vibration), an axial feeder, a stick feeder, a tray feeder and the like.

The electronic component supply device 90*a* supplies electronic components to the head 15 using electronic component hold tape to which chip type electronic components to be placed onto a substrate are to be attached. Here, the electronic component hold tape includes multiple storage chambers therein, while electronic components are stored in the storage chambers. The device 90*a* is a tape feeder which holds electronic component hold tape, feeds the electronic component hold tape held thereby, and moves the storage chambers to the hold area where the electronic components can be sucked by the nozzles of the head 15. Here, by moving the storage chambers to the hold area, the electronic components stored in the storage chambers can be exposed to specific positions and thus can be sucked and gripped by the nozzles of the head 15. The device 90*a* is not limited to the tape feeder but there can be used various kinds of chip component feeders for supplying chip type electronic components. As the chip component feeder, there can be used, for example, a stick feeder, a tape feeder, and a bulk feeder.

The head 15 is a mechanism which holds (sucks or grips) an electronic component held by the unit 14*f* or by an electronic component held by the unit 14*r* using a nozzle and mounts the electronic component held thereby onto the substrate 8 moved to a specific position by the substrate transfer part 12. Also, in the case that the unit 14*r* includes the device 90*a*, the head 15 provides a mechanism which places (mounts) a chip type electronic component (placement type electronic component) held by the device 90a onto the substrate 8. Here, the structure of the head 15 is described later. The chip type electronic component (placement type electronic component) is a leadless electronic component which does not include a lead to be inserted into an insertion hole (through hole) formed in the substrate. The placement type electronic component, as described above, includes, for example, SOP and QFP. The chip type electronic component is mounted onto the substrate without inserting the lead into the insertion hole.

The XY moving mechanism (which is also called a head moving mechanism) 16 is a moving mechanism which moves the heads 15f, 15r in the X and Y axis directions in FIG. 1, that is, along a plane parallel to the surface of the substrate 8. It includes X axis drive parts 22f, 22r and a Y axis driving part 24. The drive part 22f is connected to the head 15f and moves the head 15f in the X axis direction. The drive part 22r is connected to the head 15r and moves the head 15r in the X axis direction. The drive part 24 is connected through the X axis drive part 22 to the head 15 and moves the drive part 22f in the Y axis direction to thereby move the head 15r in the Y axis direction. The XY moving mechanism 16, by moving the head 15f in the XY axis direction, can move the head 15f to a position enabling it to face the substrate 8, or a position enabling it to face the component supply unit 14f.

The XY moving mechanism 16, by moving the head 15r in the XY axis direction, can move the head 15r to a position enabling it to face the substrate 8, or a position enabling it to face the component supply unit 14r.

Also, the XY moving mechanism 16, by moving the head 15, adjusts the relative position between the head 15 and substrate 8. Thus, the electronic component held by the head 15 can be moved to an arbitrary position on the surface of the substrate 8 and can be mounted at an arbitrary position on the surface of the substrate 8. That is, the XY moving mechanism 16 provides a transfer mechanism which moves the heads 15f, 15r on a horizontal plane (XY plane) to transfer electronic components on the electronic component supply devices 90, 90a of the component supply units 14f, 14r to the specific positions (placing positions, mounting positions) of the substrate 8.

Here, as the X axis drive part 22, there can be used various mechanisms capable of moving the head 15 in a specific direction. As, the Y axis drive part 24, there can be used various mechanisms capable of moving the X axis drive part 22 in a specific direction. As a mechanism for moving a target object in a specific direction, there can be used, for example, a transfer mechanism using a linear motor, rack and pinion and a ball screw, and a transfer mechanism using a belt.

VCS unit 17, substitution nozzle hold mechanism 18 and component storage part 19 are disposed at positions which, on the XY plane, are overlapped with the movable area of the head 15 and, in the Z direction, are disposed vertically downward of the head 15. In this embodiment, VCS unit 17, substitution nozzle hold mechanism 18 and component storage part 19 are disposed adjacent to each other between the substrate transfer part 12 and component supply unit 14r.

VCS unit 17 is an image recognition device which includes a camera for photographing the nozzle vicinity of the head 15 and an illumination unit for illuminating a photograph area. VCS unit 17 recognizes the shape of an electronic component sucked by the nozzle of the head 15 and the held state of the electronic component by the nozzle. More specifically, VCS unit 17, when the head 15 is moved to its opposed position, photographs the nozzle of the head 15 from vertically below and analyzes the photographed image, thereby recognizing the shape of the electronic component sucked by the nozzle and the held state of the electronic component by the nozzle. VCS unit 17 transmits the thus-obtained information to the control device 20.

The substitution nozzle hold mechanism 18 holds multiple kinds of nozzles in such a manner that they can be replaced by the head 15. The mechanism 18 holds a suction nozzle for holding an electronic component by suction and a grip nozzle for holding an electronic component by gripping. The head 15 replaces a nozzle held by the mechanism 18 with another nozzle, mounts the new nozzle thereon and supplies air pressure to the mounted nozzle, thereby being able to hold an electronic component to be held under a proper condition (suction or gripping condition).

The component storage part 19 is a box for storing therein an electronic component to be held by the nozzle of the head 15 but not to be mounted onto the substrate 8. That is, in the apparatus 10, this part provides a disposal box for disposing therein the electronic component not to be mounted onto the substrate 8. When electronic components held by the head 15 include an electronic component not to be mounted onto the substrate 8, the apparatus 10 moves the head 15 to a position facing the component storage part 19 and releases this electronic component to thereby charge it into the part 19.

The control device 20 controls the respective parts of the apparatus 10. The control device 20 is an assembly of various control parts. The operation part 40 is an input device through which an operator inputs an operation. It includes, for example, a keyboard, a mouse and a touch panel. It transmits various detected inputs to the control device 20. The display part 42 is a screen for displaying various kinds of information to the operator. It includes, for example, a touch panel and a vision monitor. It displays various images according to image signals input from the control device 20.

Here, the apparatus 10 of this embodiment may preferably include two parallel substrate transfer parts 12. In the case that two substrates 8 are alternately moved to the electronic component placing positions using the two substrate transfer parts 12 and the parts are placed alternately by the two heads 15, the apparatus 10 can efficiently place the electronic components on the substrates 8.

Figure 3:
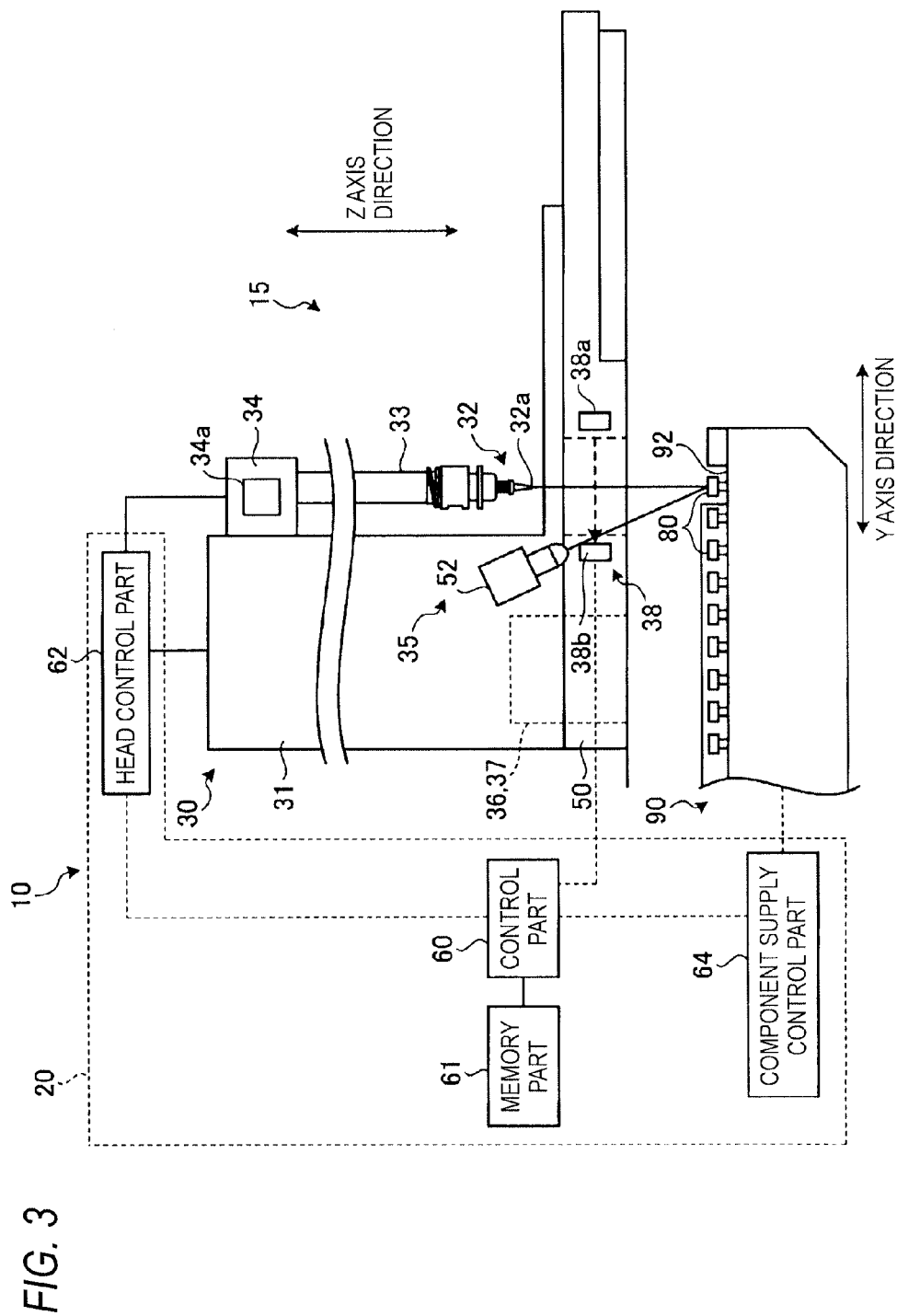
FIG. 3 is a diagram of the schematic structure of a head used in the electronic component mounting apparatus.
Figure 4:
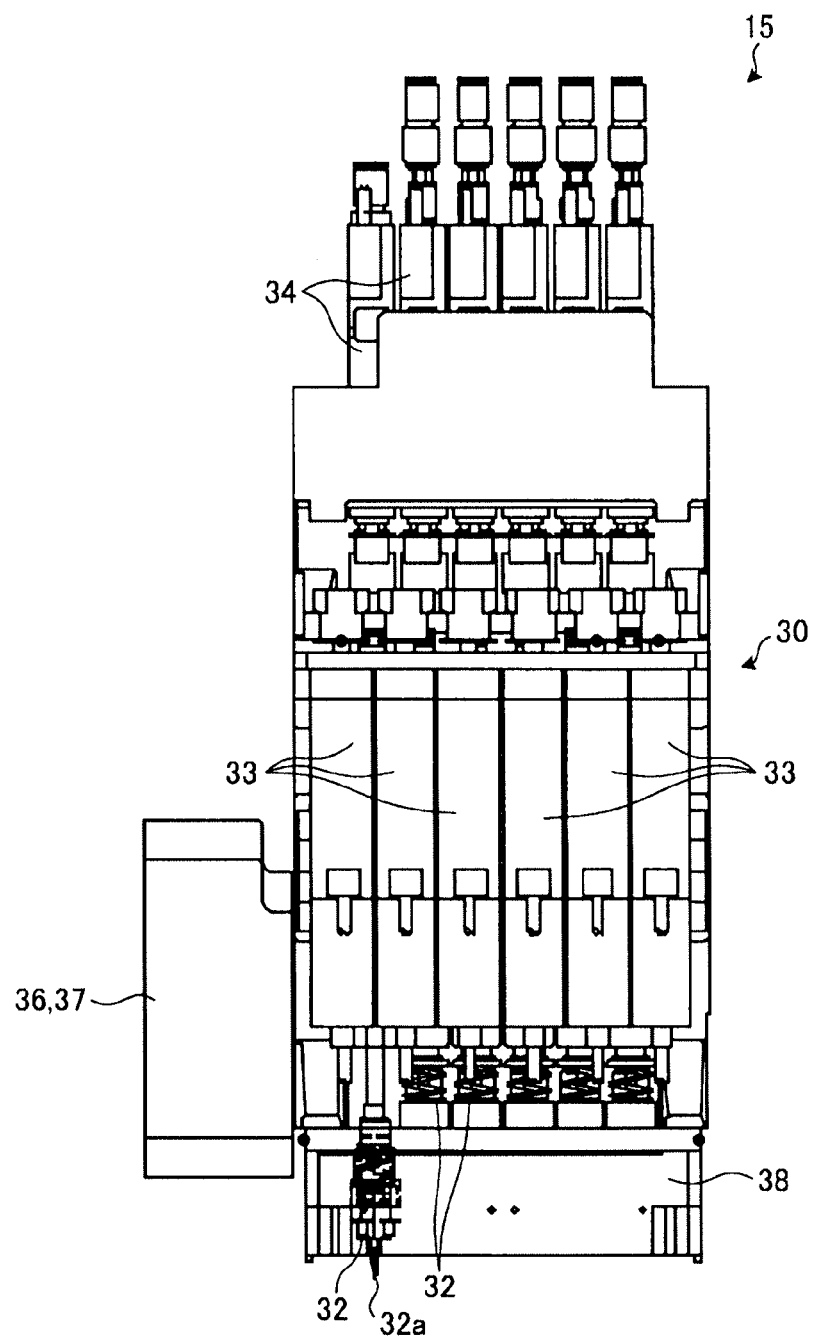
FIG. 4 is a diagram of the schematic structure of the head of the electronic component mounting apparatus.
Figure 5:
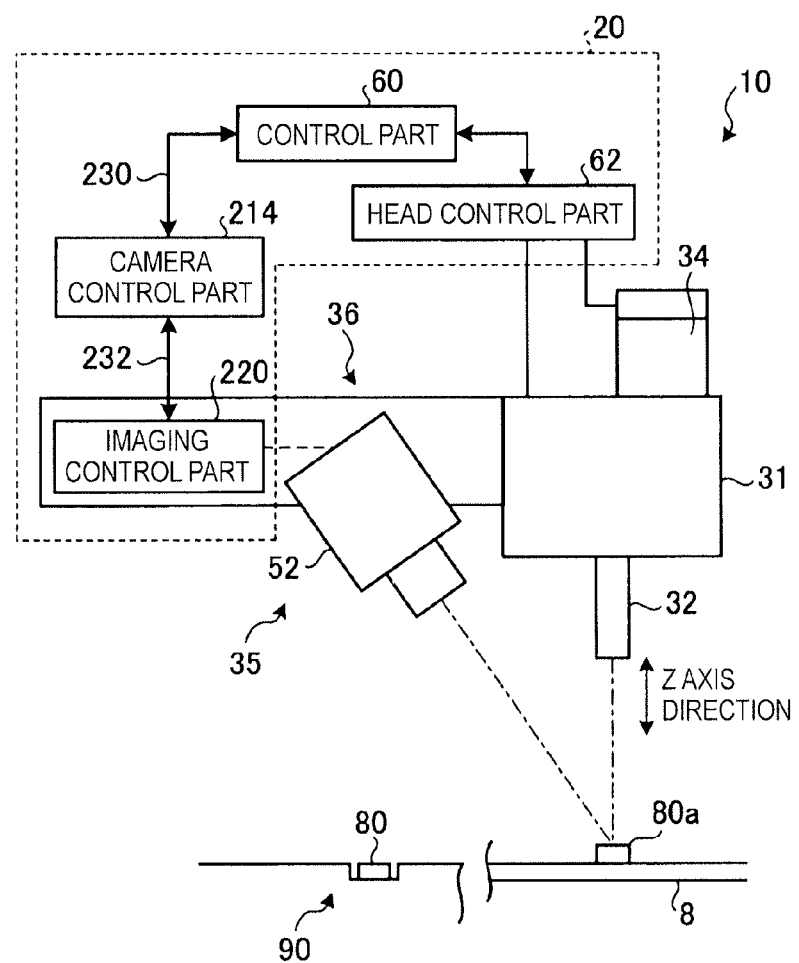
FIG. 5 is a block diagram of the schematic structure of the apparatus.
Figure 6:
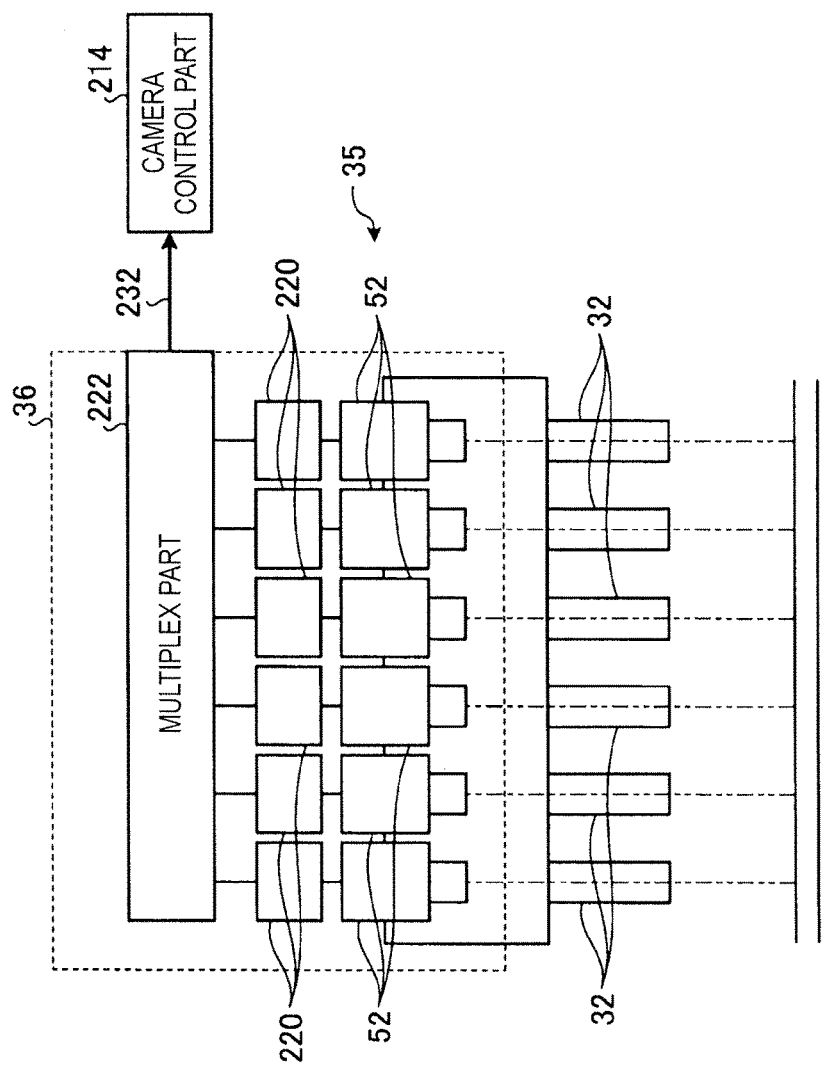
FIG. 6 is a block diagram of the schematic structure of a head camera unit.

Next, using FIGS. 3 to 6, description is given of the structure of the head 15. FIGS. 3 and 4 are respectively diagrams of the schematic structure of the head 15 of the electronic component mounting apparatus. FIG. 5 is a diagram of the schematic structure of the apparatus. FIG. 6 is a block diagram of the schematic structure of a head camera unit. Here, in FIG. 3, together with various control parts of the control device 20 for controlling the apparatus 10, there is also shown a part, namely, a supply device 90 of the component supply unit 14r. FIG. 5 further shows various control parts of the control device 20 for controlling the apparatus 10.

The head 15, as shown in FIGS. 3 and 4, includes a head main body 30, a head camera unit 35, an imaging device 36, a height sensor 37 and a laser recognition device 38. Also, the apparatus 10, as shown in FIGS. 3 and 5, includes a control part 60, a head control part 62, a component supply control part 64, a camera control part 214 and an imaging control part 220, which are parts of the control device 20. The apparatus 10 is connected to a power supply and supplies power supplied from the power supply to the respective parts, using the control part 60, head control part 62, component supply control part 64, camera control part 214, imaging control part 220 and various circuits. The control part 60, head control part 62, component supply control part 64, camera control part 214 and imaging control part 220 are described later.

In the electronic component supply device 90, the main bodies of electronic components 80 with their leads held by electronic component hold tape (radial component tape) are exposed upwardly of the device 90. Here, as the electronic components 80, there are illustrated aluminum electrolytic capacitors. However, besides aluminum electrolytic capacitors, various electronic components each having a lead can also be used. The control device 90 draws out the electronic component hold tape and moves it to thereby move the electronic components 80 held by the electronic component hold tape to a hold area (suction area, gripping area). In this embodiment, the Y-axis direction leading end vicinity of the supply device 90 serves as the hold area where the nozzles of the head 15 hold the electronic components 80 held by the electronic component hold tape. The structure of the supply device 90 is described later. Also, in the electronic component supply device 90a, similarly, a specific position provides a hold area where the nozzles of the head 15 hold the electronic components 80 held by the electronic component hold tape.

The head main body 30 includes a head support boy 31 for supporting the respective parts, multiple nozzles 32 and nozzle drive parts 34. In the head main body 30 of this embodiment, as shown in FIG. 4, there arranged six nozzles 32 in a row. The six nozzles 32 are arranged parallel to the X axis. Here, the nozzles 32 shown in FIG. 4 are respectively suction nozzles which hold their respective electronic components 80 by suction.

The head support body 31 is a support member connected to the X axis drive part 22 for supporting the nozzles 32 and nozzle drive parts 34. Here, it also supports the laser recognition device 38.

The head moving mechanism 16 moves the head support body 31 and head 15 along a horizontal plane.

The nozzle 32 is a suction mechanism for sucking and holding the electronic component 80. The nozzle 32 has an opening 32a in its leading end. The opening 32a is connected to the nozzle drive part 34 through its internal cavity and the cavity of the nozzle support part 34. By sucking the air from the opening 32a, the nozzle 32 sucks and holds the electronic component 80 in its leading end. The nozzle 32 can be removably mounted onto the nozzle support part 33 and thus, when not mounted on the nozzle support part 33, it is kept (stored) in the substitution nozzle hold mechanism 18. Also, the opening 32a of the nozzle 32 may have various shapes and sizes. Although, in this embodiment, there is illustrated a suction type nozzle having the opening 32a for sucking the electronic component 80, there can also be used a grip type nozzle which, using a pneumatically operated arm, sandwiches the electronic component 80 for holding it.

The nozzle support part 33 is a mechanism for holding the nozzle 32 by the vertically lower side end (leading end) thereof and includes, for example, a shaft movable relative to the head support body 31 by the nozzle drive part 34, and a socket connectable to the nozzle 32. The shaft is a rod-shaped member and extends in the Z axis direction. The shaft supports the socket arranged in its vertically lower side end. The shaft is supported with respect to the head support body 31 in such a manner that its portion to be connected to the socket can be moved in the Z axis direction and can be rotated in the θ direction. Here, the Z axis is an axis perpendicular to the XY plane and provides a direction perpendicular to the surface of the substrate 8. The θ direction is a direction parallel to the circumferential direction of a circle around the Z axis parallel to the direction where the nozzle drive part 34 moves the nozzle 32. The θ direction provides the rotation direction of the nozzle 32. In the shaft, its portion to be connected to the socket is moved and rotated in the Z axis direction and in the θ direction by the nozzle drive part 34.

The nozzle drive part 34 moves the nozzle support part 33 in the Z axis direction to thereby move the nozzle 32 in the Z axis direction and allows the opening 32a of the nozzle 32 to suck the electronic component 80. The nozzle drive part 34, for example, in mounting the electronic component 80, rotates the nozzle support part 33 in the θ direction to thereby rotate the nozzle 32 in the θ direction.

The nozzle drive part 34 includes, as a mechanism for moving the nozzle 32 in the Z axis direction, a mechanism having a Z axis motor 34a, specifically, a direct-drive linear motor the drive direction of which is the Z axis direction. The nozzle drive part 34 drives the Z axis motor 34a to move the nozzle 32 together with the nozzle support part 33 in the Z axis direction, thereby moving the shaft on the opening 32a of the leading end of the nozzle 32 in the Z axis direction. The nozzle drive part 34 also includes, as a mechanism for rotating the nozzle 32 in the θ direction, a mechanism constituted of, for example, a motor and a transmission element connected to the shaft of the nozzle support part 33. The nozzle drive part 34 drives the transmission element to transmit a drive force output from the motor to the shaft of the nozzle support part 33 and rotate the shaft in the θ direction, thereby rotating the leading end of the nozzle 32 in the θ direction as well.

The nozzle drive part 34 includes, as a mechanism for sucking the electronic component 80 using the opening 32a of the nozzle 32, that is, as a suction mechanism having, for example, an air pipe connected to the opening 32a of the nozzle 32, a pump connected to the air pipe and an electromagnetic valve for switching the opening and closing of a pipeline for the air pipe. The nozzle drive part 34 drives the pump to suck the air of the air pipe and switch the opening and closing of the electromagnetic valve, thereby switching whether the air is sucked from the opening 32a or not. The nozzle drive part 34, by opening the electromagnetic valve to suck the air from the opening 32a, allows the opening 32a to suck (hold) the electronic component 80 and, by closing the electromagnetic valve to prevent the suction of the air from the opening 32a, releases the electronic component 80 sucked by the opening 32a, that is, sets a state where the electronic component 80 is not sucked (held) by the opening 32a.

In the case that, when holding the main body of the electronic component 80, the upper surface of the main body has a shape incapable of being sucked by the nozzle (suction nozzle) 32, the head 15 of this embodiment uses a grip nozzle to be described below. The grip nozzle, similarly to the suction nozzle, by sucking and releasing the air to open and close a movable piece relative to a fixed piece, can grip and release the main body of the electronic component 80 from above. The head 15, by driving the nozzle drive part 34 to move the nozzle 32 and performing a nozzle replacing operation, can replace the nozzle to be driven by the nozzle drive part 34.

The head camera unit 35 is fixed to the head support body 31 of the head main body 30. It is a unit which photographs an electronic component 80 held by the nozzle 32 and a target electronic component 80 to be held by the nozzle 32 to thereby detect the state and the like of the electronic component 80.

Here, the state of the electronic component 80 includes, for example, whether the electronic components 80 are held at a proper attitude by the nozzles 32 or not, whether the electronic components 80 to be held by the nozzles 32 are disposed at the specific positions of the component supply devices 90, 90a or not, and whether the electronic components 80 held by the nozzles 32 are placed at specific positions on the substrate 8 or not. The head camera unit 35 includes multiple head cameras 52. The head cameras 52 are devices for photographing images in fields opposed thereto and respectively include an imaging device, an illuminating part, a baffle and the like. One head camera 52 is provided for one nozzle 32. That is, in this embodiment, six head cameras 52 are provided for six nozzles 32 respectively. The head camera 52 photographs the electronic component 80 held by its corresponding nozzle 32. The head camera 52 is disposed inclined with respect to the Z direction, that is, inclined with respect to the moving path of the nozzle 32. Therefore, it photographs the electronic component held by the nozzle 32 and the substrate set at the mounting position from a direction inclined with respect to the Z direction, namely, from obliquely of the part and substrate.

The imaging device 36 shown in FIG. 4 is fixed to the head support body 31 of the head main body 30 and photographs an area opposed to the head 15, for example, the substrate 8 or the substrate 8 with the electronic component 80 mounted thereon. It includes a camera and an illumination device and, while illuminating the field using the illumination device, obtains images using the camera. Thus, there can be photographed the images of the position opposed to the head main body 30, for example, various images of the substrate 8 and component supply unit 14. For example, it photographs the images of a BOC mark (which is hereinafter also called BOC simply) as a reference mark formed on the surface of the substrate 8 and the through hole (insertion hole). Here, in the case that other reference mark than BOC mark is used, the image of this reference mark used is photographed. One imaging device 36 is provided for one head 15. The camera of the imaging device 36 is disposed parallel to the Z direction and thus the imaging device 36 photographs the images from a direction parallel to the Z direction.

The height sensor 37 is fixed to the head support body 31 of the head main body 30 and is used to measure an area opposed to the head 15, for example, the distance of the substrate 8 or the substrate 8 with the electronic component 80 placed thereon. As the height sensor 37, there can be used a laser sensor which includes a light emitting element for radiating a laser beam and a light receiving element for receiving the laser beam that returns after reflected at the opposed position, thereby measuring the distance between the sensor and the opposed area according to the time taken from emission of the laser beam to the reception thereof. Also, the height sensor 37, using the position thereof and the position of the substrate in the measuring time, processes the distance between itself and the opposed portion to thereby detect the height of the opposed portion, specifically, the height of the electronic component 80. Here, detection of the height of the electronic component 89 according to the measured result of the distance from the electronic component 80 may also be made by the control part 60.

The laser recognition device 38 includes a light source 38a and a light receiving element 38b. The device 38 is built in a bracket 50. The bracket 50, as shown in FIG. 3, is connected to such lower side of the head support body 31 as exists on the substrate 8 and component supply device 90 side. The device 38 is a device which illuminates a laser beam to the electronic component 80 sucked by the nozzle 32 of the head main body 30 to detect the state of the electronic component 80. Here, the state of the electronic component 80 includes, for example, the shape of the electronic component 80 and whether the attitude of the electronic component 80 sucked by the nozzle 32 is proper or not. The light source 38a is a light emitting element which outputs a laser beam. The light emitting element 38b is disposed at a position in the Z axis direction, that is, a position which is the same in height and is opposed to the light source 38a. Description is given later of a shape recognition process to be performed by the laser recognition device 38.

Next, description is given of the control function of the structure of the apparatus 10. As shown in FIGS. 3 and 5, the apparatus 10 includes, as the control device 20, a control part 60, a memory part 61, a head control part 62, a component supply control part 64, a camera control part 214 and an imaging control part 220. These control parts are respectively constituted of a member having a calculation function and a storage function, such as a CPU, a ROM and a RAM. In this embodiment, for convenience of explanation, there are used the multiple control parts. However, a single control part may also be used. In the case that the control function of the apparatus 10 is performed by a single control part, it may also be realized by a single operation device or by multiple operation devices.

The control part 60 is connected to the respective parts of the apparatus 10 and, according to an operation signal input therein and information detected by the respective parts of the apparatus 10, executes programs stored to control the operations of the respective parts. The control part 60 controls, for example, the transfer operation of the substrate 8, the drive operation of the head 15 by the XY moving mechanism 16, and the shape detection operation by the laser recognition device 38. The control part 60, as described above, gives the head control part 62 various instructions to control the control operation to be performed by the head control part 62 as well. It also controls the control operation to be performed by the component supply control part 64.

The memory part 61 is connected to the control part 60 and has a storage function such as a ROM and a RAM. Here, the memory part 61 may be provided integrally with the control part 60, or separately. The memory part 61 stores data, for example, data obtained from the respective parts by the control part 60 and data operated by the control part 60. The memory part 61 stores, for example: design data including through hole coordinates design values, reference mark coordinates design values and electronic component mounting coordinates design values; the shapes of various electronic components; the suction conditions and the correcting conditions of the suction processing; and, production programs. Here, the memory part 61 can delete unnecessary data under the control of the control part 60.

The head control part 62, which is connected to the nozzle drive part 34, various sensors provided on the head support body 31 and control part 60, controls the nozzle drive part 34 to control the operation of the nozzle 32. Also, according to an operation instruction supplied from the control part 60 and the detection results of various sensors (such as a distance sensor), it controls the electronic component 80 sucking (holding)/releasing operations of the nozzles 32, and the rotation operations and Z-axis direction moving operations of the nozzles 32. The control of the head control part 62 is described later.

The component supply control part 64 controls the supply operation of electronic components 80 by the component supply units 14f, 14r. Control parts 64 may be provided apiece for the respective electronic component supply devices 90, 90a or a single control part 64 may be used to control all of the devices 90, 90a. For example, it controls the electronic component hold tape draw-out operation (moving operation) by the device 90, lead cutting operation and holding operation of radial lead type electronic components. With the component supply unit 14 having the electronic component supply device 90a, the control part 64 controls the electronic component hold tape draw-out operation by the device 90a and the like. The control part 64 executes various operations according to instructions from the control part 60. The control part 64 controls the electronic component hold tape and the electronic component hold tape draw-out operation to thereby control the electronic component hold tape or the movement of the electronic component hold tape.

Here, in the above embodiment, description has been given of a case where a suction nozzle is used as a nozzle to be mounted on the head. However, this is not limitative. As a nozzle to be mounted on the head, a grip nozzle for gripping an electronic component can also be used. The apparatus 10 selects the kind of nozzles for holding the electronic component 80 according to the kind of the electronic components 80, thereby enabling proper holding of the electronic component 80. Specifically, by selecting any one of the suction nozzle and grip nozzle according to the electronic component 80 to be held, and further by switching use of the kind of nozzles, a larger number of kinds of electronic components 80 can be mounted by a single electronic component mounting apparatus.

The camera control part 214 is an operation processing part capable of executing various operation processings. It obtains various kinds of information necessary for photographing by the head cameras 52 from various kinds of information provided by the control part 60, and determines the photographing conditions of the head cameras 52. Here, the photographing condition includes photographing timing, the position of the nozzle 32 to be photographed, the exposure and magnification of the head camera 52 and the like. It transmits the determined photographing condition to the imaging control part 220. It also analyzes image data obtained by the head camera 52 and transmitted from the imaging control part 220. It transmits the analyzed results of the image data to the control part 60. It may also be structured such that, as the results of the analysis, it transmits the fact of occurrence of an error or only the contents of the error.

Here, the control part 214 is connected to the control part 60 by a wiring 230. The wiring 230 is a signal line for receiving and transmitting various kinds of information. As the wiring 230, there may preferably be used a wiring "Ethernet (registered trade mark)".

The imaging control part 220 controls the imaging operation of the head camera 52 and obtains data about images photographed by the head camera 52. It determines a photographing condition according to an instruction from the camera control part 214 and controls the head camera 52 under the determined photographing condition to obtain images. Here, it can obtain, through the control part 60 and camera control part 214, an encoder signal of the Z axis direction drive mechanism of the nozzle drive part 34 for driving the nozzle 32 to be photographed, and thus can obtain information about the position of the nozzle 32 in the Z axis direction. On detecting that the position of the nozzle 32 obtained according to the encoder signal is a specific position determined by the camera control part 214, the imaging control part 220 photographs and obtains the image of the nozzle 32. In this image photographing, it can photograph the images of the electronic components 80 held at the hold positions 92 of the electronic component supply device 90 including the electronic components 80a mounted on the substrate 8. Here, in this embodiment, other target objects than the above are also photographed. The imaging control part 220 transmits data about the photographed images to the camera control part 214.

Here, the imaging control parts 220, as shown in FIG. 6, are disposed apiece for the respective head cameras 52. One imaging control part 220 controls an imaging operation to be performed by its corresponding head camera 52. The imaging control parts 220 are connected through a multiplex part 222 and a wiring 232 to the camera control part 214.

Also, the head cameras 52 are arranged one by one at regular intervals along the X axis direction (substrate transfer direction) correspondingly to their associated nozzles 32. This enables easy confirmation of the suction and mounting states of the electronic components of the nozzles 32. Also, when the other attention areas such as the bad mark forming positions, mounting points, their peripheries and fluxer liquid surfaces are photographed, images photographed by multiple head cameras can be easily synthesized to form an image where the fields of the head cameras are linked together. Further, as shown in FIG. 6, when the centers of the nozzles 32 are coincident with the centers of the head cameras 52, the images can be synthesized more easily and common use of the parts of the head cameras 52 and the like can be realized.

The multiplex part 222 is constituted of a multiplexer, a de-multiplexer and the like. It multiplexes signals (data) output from the imaging control parts 220 and transmits them to the camera control part 214 through the wiring 232. It also divides signals transmitted from the camera control part 214 by the single wiring 232 toward their corresponding image control parts 220, and transmits them to their corresponding imaging control parts 220.

The wiring 232 is a single wire and is used to connect together the camera control part 214 and six imaging control parts 220 through the multiplex part 222. Here, as the wiring 232, there may preferably be used a wiring of IEEE1394 system. The apparatus 10, using the multiplex part 222 and wiring 232, transmits image data obtained by the six imaging control parts 220 to the camera control part 214 through serial transfer.

In the apparatus 10, since the wiring 232 for connecting the imaging control parts 220 and camera control part 214 and the wiring 230 for connecting the camera control part 214 and control part 60 are arranged separately as described above, transmission and reception of information between the respective devices can be performed individually, thereby enabling smooth execution of information processing.

Also, in the apparatus 10, since wires for connection to the six imaging control parts 220 are gathered into one and the wiring 232 for connection to the camera control part 214 is constituted of a single wire, the number of wires for connection between the devices can be reduced. This can simplify the structure of the apparatus and thus can save space. Also, since a wiring of IEEE1394 system is applied to the wiring 232 and transmission of image data is carried out through serial transfer, even when the wiring 232 is constituted of a single wire, images can be transmitted to the camera control part 214 with no processing delay.

Figure 7:
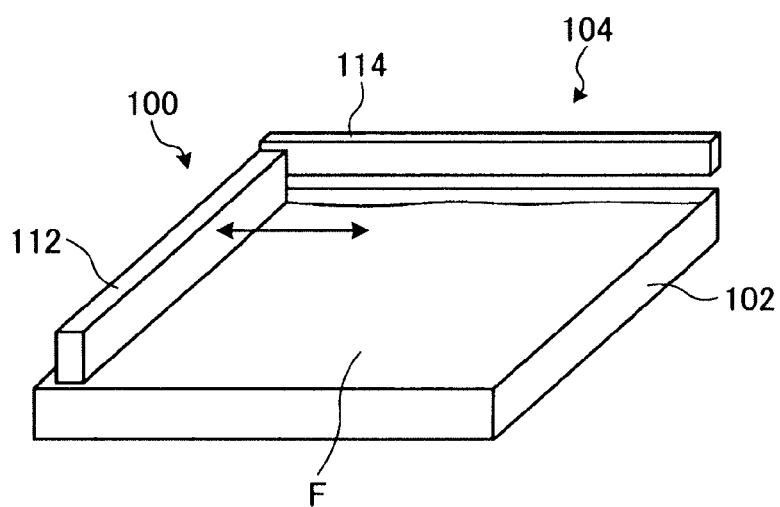
FIG. 7 is a diagram of the schematic structure of a fluxer application device.

Next, description is given of the fluxer application device 100 using FIG. 7. This is a device which applies the fluxer of the electronic component 80 held by the nozzle 32. It is interposed between the component supply unit 14f and substrate transfer part 12: that is, it is disposed on the opposite side of VCS unit 17, substitution nozzle hold mechanism 18 and component storage part 19 across the substrate transfer part 12. However, the position of the device 100 is not limited to this. It may only be able to apply the fluxer to an electronic component held by the nozzle 32. That is, it may only be located at a position where it does not interfere with the movement of the nozzle 32 within the moving range of the nozzle 32. It may be located, for example, near the electronic component supply device 90 as part of the component supply unit 14, or may be provided apiece for each of the devices 90. Or, it may also be arranged in line with VCS unit 17, substitution nozzle hold mechanism 18 and component storage part 19.

The fluxer application device 100 includes a fluxer storage part 102 and a fluxer flattening mechanism 104. The fluxer storage part 102 is a box in which a fluxer F is stored and the upper surface of which is open. The fluxer F is a material which, when applied to the electronic component 80, facilitates the melting of solder held between the electronic component 80 and substrate. The fluxer F may also include solder. The fluxer storage part 102, due to the open upper surface, can lower an electronic component held by the nozzle 32 down to the liquid surface of the fluxer F, bring the electronic component into contact with the fluxer F and thus apply the fluxer F to the electronic component. Here, the fluxer F is a high-viscosity material and, when the electronic component comes in contact therewith, the shape of its liquid surface is varied, thereby providing an uneven liquid surface.

The fluxer flattening mechanism 104 flattens the liquid surface of the fluxer F in the fluxer storage part 102, while it includes a bar 112 and a drive part 114 for moving the bar 112. The bar 112 is a rod-like member to come into contact with the liquid surface of the fluxer F in the fluxer storage part 102. The drive part 114 moves the bar 112 along the liquid surface of the fluxer F. The fluxer flattening mechanism 104 moves the bar 112 using the drive part 114 to flatten the surface of the fluxer F using the bar 112, thereby flattening the liquid surface of the fluxer F.

Figure 8:
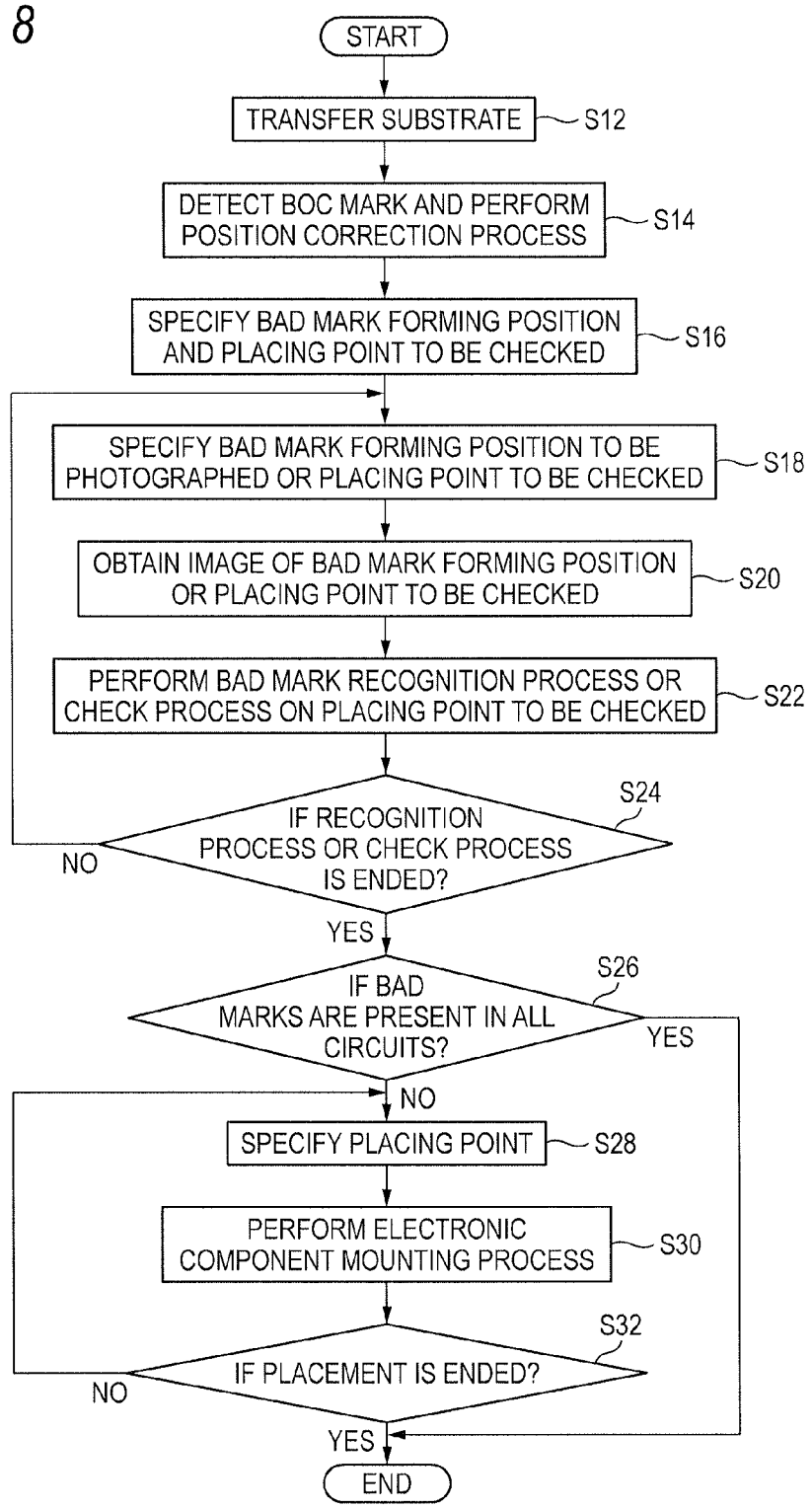
FIG. 8 is a flow chart of an example of the operation of the apparatus.
Figure 9:
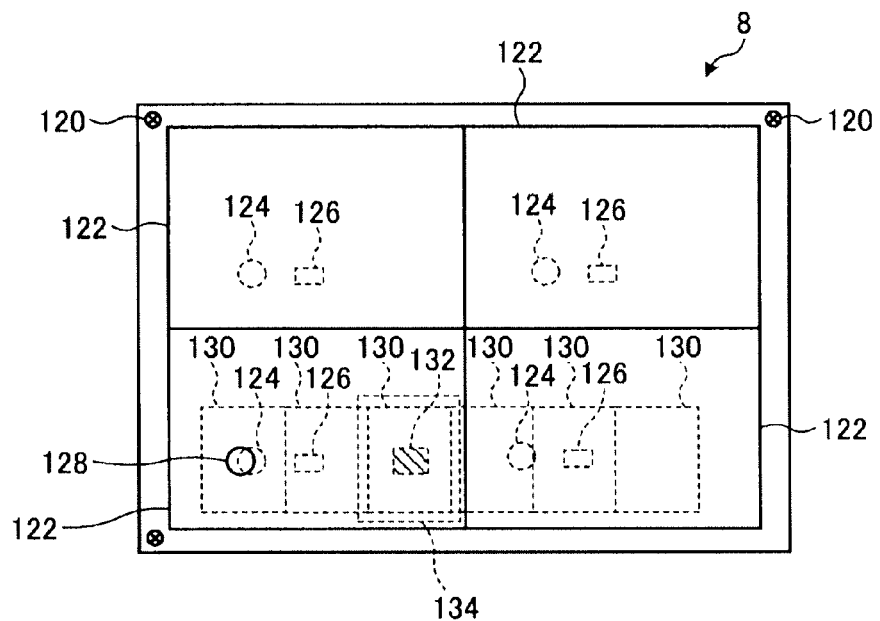
FIG. 9 is a diagram of an example of a substrate.

Next, description is given of the control operation of the apparatus 10 using FIGS. 8 to 12. FIGS. 8, 10 to 12 are respectively flow charts of an example of the operation of the apparatus. FIG. 9 is a diagram of an example of a substrate. In the following description, there is illustrated an example in which, as an electronic component, a placement type electronic component is placed on a placing point (mounting point). However, also when an insertion type electronic component is placed on an inserting point (mounting point), a similar processing is performed.

Referring to FIG. 8, description is given of a processing for manufacturing a substrate with an electronic component mounted thereon by the apparatus 10. Here, although the substrate 8 may be structured such that all electronic components are mounted thereon by a single apparatus 10, it is manufactured as a completed substrate through mounting processings, pre-mounting processings, post-mounting processings and other similar processings by multiple apparatuses 10 and operators.

The control device 20 drives the substrate transfer part 12 to transfer the substrate 8 to a specific position (Step S12). Referring to FIG. 9, an example of the substrate 8 is explained. In the substrate 8, there is formed a BOC mark 120 serving as a reference mark for the placing position of an electronic component to be surface mounted onto the outer edge of the substrate. In this embodiment, BOC mark 120 is formed at three positions. The substrate 8 is a multi-chamfered substrate of a type that product substrates having the same shape are manufactured from a single substrate. In the substrate 8, four unit substrates 122 are arranged in two lines and in two rows. The number of unit substrates to be provided in one substrate 8 is not limited to this. The unit substrate 122 has a bad mark forming position for arranging a bad mark thereon and a mounting point (placing point) 126 for mounting an electronic component thereon. The bad mark is a mark which, when a unit substrate 122 is omitted from unit substrates for mounting electronic component thereon for some reason, is formed on this unit substrate 122. The bad mark forming position 124 is a portion which, when forming a bad mark on the unit substrate 122, is set as a position for forming this bad mark. In the unit substrate 122 shown left downward in FIG. 9, a bad mark 128 is formed at a bad mark forming position 124. The bad mark 128 may be bonded or applied to a unit substrate. In FIG. 9, one mounting point 126 is provided on one unit substrate 122. However, actually, there are provided multiple mounting points 126. Also, since the four unit substrates 122 are to be manufactured as the same products, the relative positions between the bad mark forming positions 124 and mounting points 126 are the same positions. The apparatus 10 mounts an electronic component onto such substrate as shown in FIG. 9.

Returning to FIG. 8, description is continued. The control device 20, on transferring the substrate 8, detects the BOC mark 120 of the substrate 8 and performs a position correcting processing (Step S14). Specifically, the apparatus 10, while moving the head 15, drives the imaging device 36 to photograph the substrate 8 and analyze the-thus photographed image to thereby detect the position of the BOC mark 120. The apparatus 10 corrects the position (shift from the reference position) of the substrate 8 according to the position of the BOC mark 120.

The control device 20, after completion of the position correcting processing, specifies the bad mark forming position and the position of a placing point to be checked (Step S16). According to the BOC mark coordinates design values (design position of BOC), the relationship between the bad mark forming position 124 and the design position of the placing point 126, and the detected position of the BOC mark 120, the control device 20 specifies the coordinates of the bad mark forming position 124 and placing point 126 of the substrate 8 transferred. Here, the mounting point to be checked is a placing point which, of the placing point 126 for an electronic component mounting thereon, is set to photograph an image and check the state of the placing point from the thus photographed image. The placing point to be checked may be all of the placing points of the substrate 8 or some of them. In this embodiment, on the placing points to be checked, images before and after mounting electronic components are obtained; and, thereafter, the confirmation of the state of the mounting point before mounting, the evaluation of the states before and after mounting, the check of the state after mounting and the like are carried out.

On specifying the bad mark forming position and the position of a placing point to be checked, the control device 20 specifies a bad mark forming position to be photographed or the position of a placing point to be checked (Step S18). According to the bad mark forming position and the position of the placing point to be checked specified, the control device 20 specifies a bad mark forming position to be processed or the position of a placing point to be checked.

The control device 20 obtains the image of the bad mark forming position to be photographed or the image of the position of the placing point to be checked (Step S20). Here, the apparatus 10 of this embodiment drives the head camera unit 35 to obtain the image of a bad mark forming position to be photographed and the image of the position of the placing point to be checked.

Figure 10:
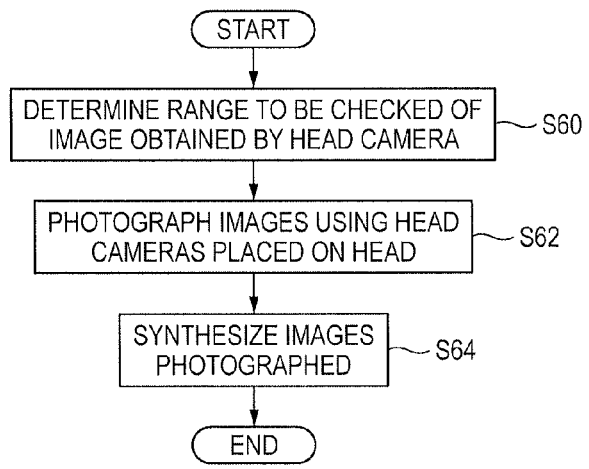
FIG. 10 is a flow chart of an example of the operation of the apparatus.

Referring to FIGS. 9 and 10, description is given below of an image obtaining process to be performed by the head camera unit 35. The processing operation is described with reference to FIG. 10. The control device 20 determines a range to be processed for the images obtained by the head cameras (Step S60). That is, there is determined a range where, of images obtained by the head cameras 52 of the head camera unit 35 (images which can be obtained by imaging elements), images to be analyzed are actually obtained. In the substrate shown in FIG. 9, ranges 130 are determined. Here, the range 130 is in contact with the same ranges 130 set in adjoining head cameras 52 as well. Thus, as shown in FIG. 9, the ranges 130, where images are photographed by the multiple head cameras 52 of the head camera unit 35, are linked with each other. The range 130 may also be overlapped in part with the same ranges 130 set in adjoining head cameras 52 as well. Here, the head camera 52, even when it has the same distance relative to the substrate 8, can obtain the image of the largest range 134 and, when the range 130 smaller than this is a range to be processed, it can reduce the amount of images to be processed. Here, the head camera 52, when observing an electronic component held by its corresponding nozzle, sets a range 132 to be analyzed, which is smaller than the range 130. That is, the control device 20, when obtaining the image of the bad mark forming position or the image of the mounting point, obtains the image of a range wider than a range when observing an electronic component held by a corresponding nozzle.

The control device 20, on specifying the range to be processed, drives a head camera placed on the head to photograph images (Step S62). When a bad mark 124 existing left downward is a target, it obtains the image of the range 130 shown in FIG. 9. In this case, it drives all head cameras 52 of the head camera unit 35 to obtain images.

On obtaining the images, it synthesizes the obtained images (Step S64). That is, the six images of the ranges 130 photographed by the six head cameras 52 are synthesized. Here, since the ranges 130 are linked with each other, an image obtained by synthesizing the images of the six ranges 130 provides an image of a wide range constituted of the ranges linked together without a break.

The control device 20, on obtaining the image, performs a bad mark recognition process or a check process on the placing point to be checked (Step S22). The bad mark recognition process is a process to detect whether a bad mark is formed at a bad mark forming position contained in the image or not. When the bad mark is formed, it omits a unit substrate with the bad mark formed thereon from target unit substrates for placing electronic components thereon. The check process on the placing point to be checked is a process which extracts the image of the placing point before mounting of an electronic component from the images and specifies the state of the placing point. For example, the process checks whether the placing point is in an electronic component mountable state or not, a foreign substance exists or not, and the like.

Here, as shown in FIG. 9, the image obtained by the head camera unit can include, in addition to the specified bad mark or placing point to be checked, other multiple bad marks or multiple placing points to be checked. In this case, the control device performs a bad mark recognition process also on other bad marks or a check process also on other placing points to be checked, which are contained in the image.

On performing the bad mark recognition process or check process on the placing points to be checked, the control device 20 checks whether the recognition process and check process are ended or not (Step S24). It checks whether the bad mark recognition process on all bad mark forming positions of the substrate 8 is ended or not and the check process on all placing points to be checked is ended or not. When the recognition process and check process are not ended (No in Step S24), the control device 20 returns to Step S18, where it specifies a next bad mark forming position or a next placing point and performs the above processes. The next bad mark forming position or the next placing point are a bad mark forming position or a placing point in a range where images are not obtained by the head camera unit 35. The bad mark forming position or placing point, which is contained when the specified bad mark forming position or spacing point is photographed and is subjected to the recognition process and check process, is regarded that the recognition process and check process thereon are ended and, therefore, it is omitted from bad mark forming positions or placing points to be processed.

When the recognition process and check process thereon are ended (Yes in Step S24), the control device 20 checks whether bad marks are present on all circuits (unit substrates) or not (Step S26). When the bad marks are present on all circuits (Yes in Step S26), all unit substrates are omitted from substrates with electronic components placed thereon, thereby ending the process. Here, the substrate may also be discharged.

When no bad mark is present in all circuits (unit plates) (No in Step S26), that is, when it is determined that there is present any unit substrate with no bad mark formed on, the control device 20 places an electronic component onto the unit substrate with no bad mark formed thereon.

The control device 20, firstly, specifies a placing point for mounting an electronic component thereon (Step S28) and performs an electronic component mounting process for mounting an electronic component on the specified placing point (Step S30). On mounting the electronic component on the placing point, it checks whether the placement is ended or not (Step S32). When the mounting is not ended (No in Step S32), that is, when there exists a mounting point with no electronic component mounted thereon, it returns to Step S28, specifies a next placing point and performs the above process. In this manner, the control device 20 repeats the processes of Step S28 to S32 until electronic components are mounted on all placing points. When the placement is ended (Yes in Step S32), it discharges the substrate, thereby ending this process. Here, when an error occurs or an end instruction is input, it may stop the process.

Figure 11:
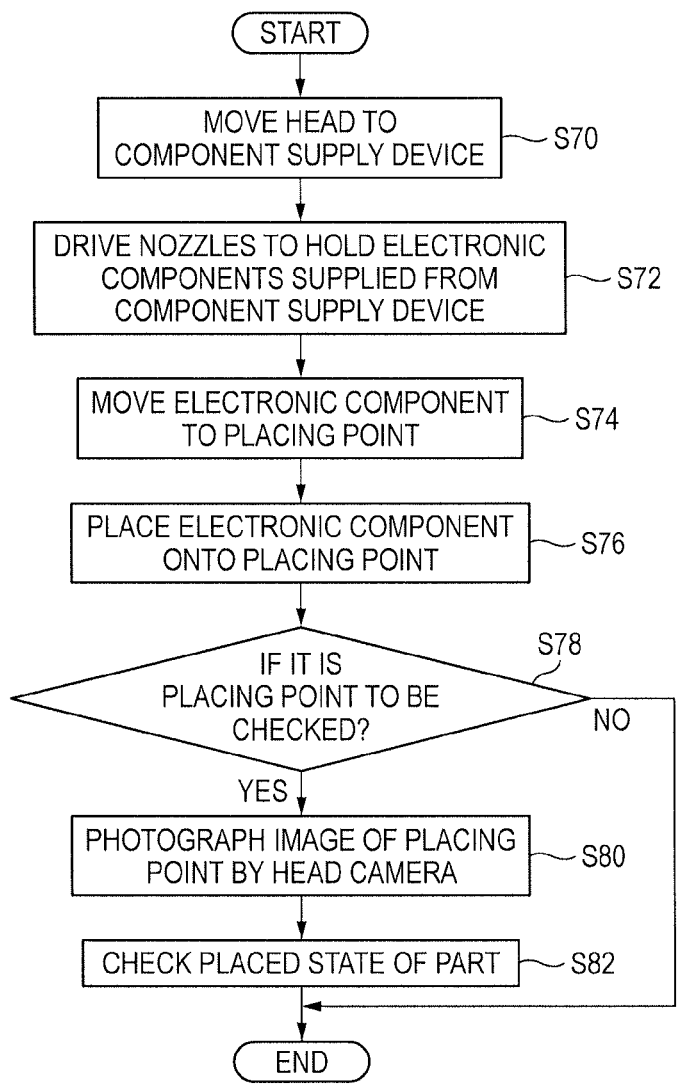
FIG. 11 is a flow chart of an example of the operation of the apparatus.

Here, referring to FIG. 11, description is given of an example of the electronic component mounting process. The control device 20 moves the head to an electronic component supply device holding an electronic component to be mounted (Step S70), and allows the nozzle to hold an electronic component supplied from the component supply device (Step S72). This enables the nozzle to transfer the electronic component. After then, the control device 20 moves the head to move the electronic component held by the nozzle to a placing point (Step S74), and places the electronic component on the placing point (Step S76). On placing the electronic component, the control device 20 checks whether the placing point with the electronic component placed thereon is a placing point to be checked or not (Step S78). When it is not the placing point to be checked (No in Step S78), the control device 20 ends this process.

When it is the placing point to be checked (Yes in Step S78), the control device 20 drives the head camera to photograph the image of the spacing point (Step S80), and checks the placed state of the electronic component (Step S82), thereby ending this process. When obtaining the image of the placing point after the electronic component is placed, the control device 20 may drive only the head camera corresponding to the nozzle with the electronic component mounted thereon to photograph the image, or may drive the multiple head cameras to photograph the images. On obtaining the image of the placing point after the electronic component is placed, the control device 20 checks whether the electronic component is placed properly or not.

In this manner, by obtaining the images of the bad mark forming positions or the placing points using the multiple head cameras 52 of the head camera unit 35, the apparatus 10 can obtain the image of a wide range through one-time acquisition of images. Specifically, the image of a wider range than a range where an image is obtained by the imaging device 36 can be obtained. Also, by adjusting the ranges to be photographed by the head cameras 52, the apparatus 10 can obtain the image of the linked ranges.

This enables acquisition of the images of the multiple bad mark forming positions or placing points through one-time acquisition of images, whereby a larger number of bad mark forming positions or placing points can be detected and checked simultaneously. This can shorten the time necessary for the recognition process of the bad marks and for the check of the states of the placing points before the electronic components are mounted, thereby enabling efficient manufacture of substrates. Also, when a bad mark forming position and a placing point are included in one image, by processing both of them using one image, the process can be performed efficiently.

Also, the control device 20, by setting (changing) a range for obtaining an image according to a target to be photographed, can adjust image processing amounts corresponding to the respective processes, thereby enabling prevention of the increased loads of the processes.

Figure 12:
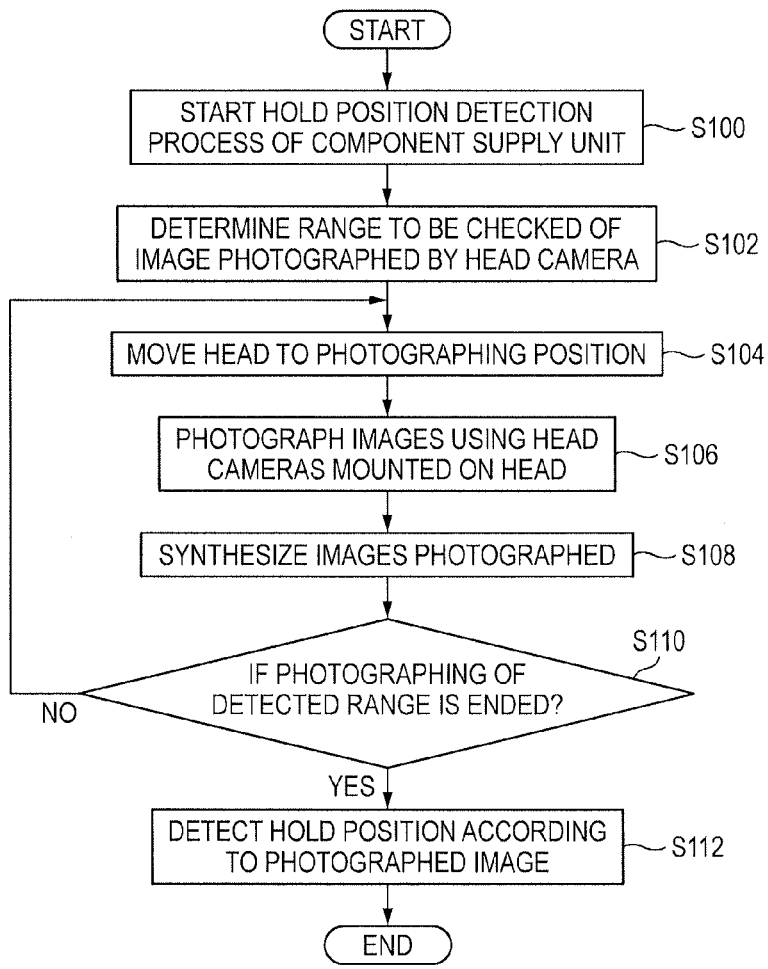
FIG. 12 is a flow chart of an example of the operation of the apparatus.
Figure 13:
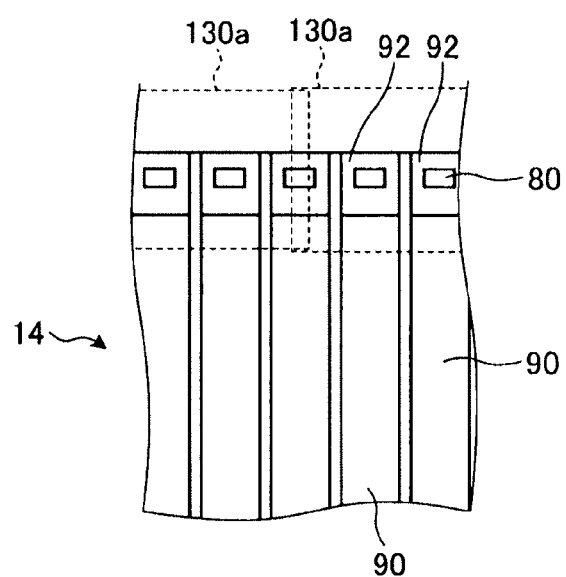
FIG. 13 is an explanatory view of the operation of the apparatus.

Next, referring to FIGS. 12 and 13, description is given of another example of the operation of the electronic component mounting apparatus. FIG. 12 is a flow chart of an example of the operation of the apparatus. FIG. 13 is an explanatory view of the operation of the apparatus. A process shown in FIGS. 12 and 13 is a process to be performed when specifying the position from which the component supply unit 14 supplies an electronic component, namely, the position (hold position) where the component supply device holds an electronic component. That is, this is a process which, when the electronic component of the component supply device is to be held by the nozzle, is performed to set a position to which the nozzle should be moved.

The control device 20, on detecting an instruction for detecting the hold position, starts the hold position detection process of the component supply unit (Step S100), and determines the ranges to be processed of images obtained by head cameras (Step S102). That is, it determines such ranges of images (images obtainable by imaging elements) obtained by the head cameras 52 of the head camera unit 35 as are obtained actually as images to be analyzed. Specifically, when the periphery of the hold position 92 of the component supply device shown in FIG. 13 is photographed, it determines a range 130a to be analyzed. Here, the ranges 130a are ranges which overlap in part with the same ranges 130a set also in adjoining head cameras 52. Thus, as shown in FIG. 13, the ranges 130a to be photographed by the multiple head cameras 52 of the head camera unit 35 are linked together.

On determining the ranges to be processed, the control device 20 moves the head to the photograph position (Step S104), drives multiple head cameras placed on the head to photograph images (Step S106), and synthesizes the images photographed. Here, since the ranges 130a are in part overlapped with each other, an image obtained by synthesizing the images of the six ranges 130a provides the image of a wide range constituted of the six ranges linked together with no break.

On synthesizing the images, the control device 20 checks whether photographing of the ranges to be checked is ended or not (Step S110). Specifically, it checks whether the images of all ranges to be checked for the hold positions are obtained or not. When not ended (No in Step S110), it returns to Step S104, moves to a next photograph position, photographs images, and synthesizes images photographed. The control device 20 obtains the images of the ranges to be checked in this manner. Here, the control device 20 may synthesize further the synthesized images, or may treat them as separate images.

When photographing of the ranges to be checked is ended (Yes in Step S110), the control device 20 detects the hold position according to the photographed images (Step S112), thereby ending this process.

When detecting the hold positions as well, the apparatus 10 can synthesize images photographed by the multiple head cameras 52 of the head camera unit 35 to obtain the image of a wide range, thereby enabling efficient execution of the image processing. Also, by using images photographed by the head cameras 52, the hold positions can be photographed from obliquely. This can detect the solid shapes of the hold positions, the amounts of projection of the electronic components, and the like. Thus, the hold positions can be detected with higher precision.

Figure 14:
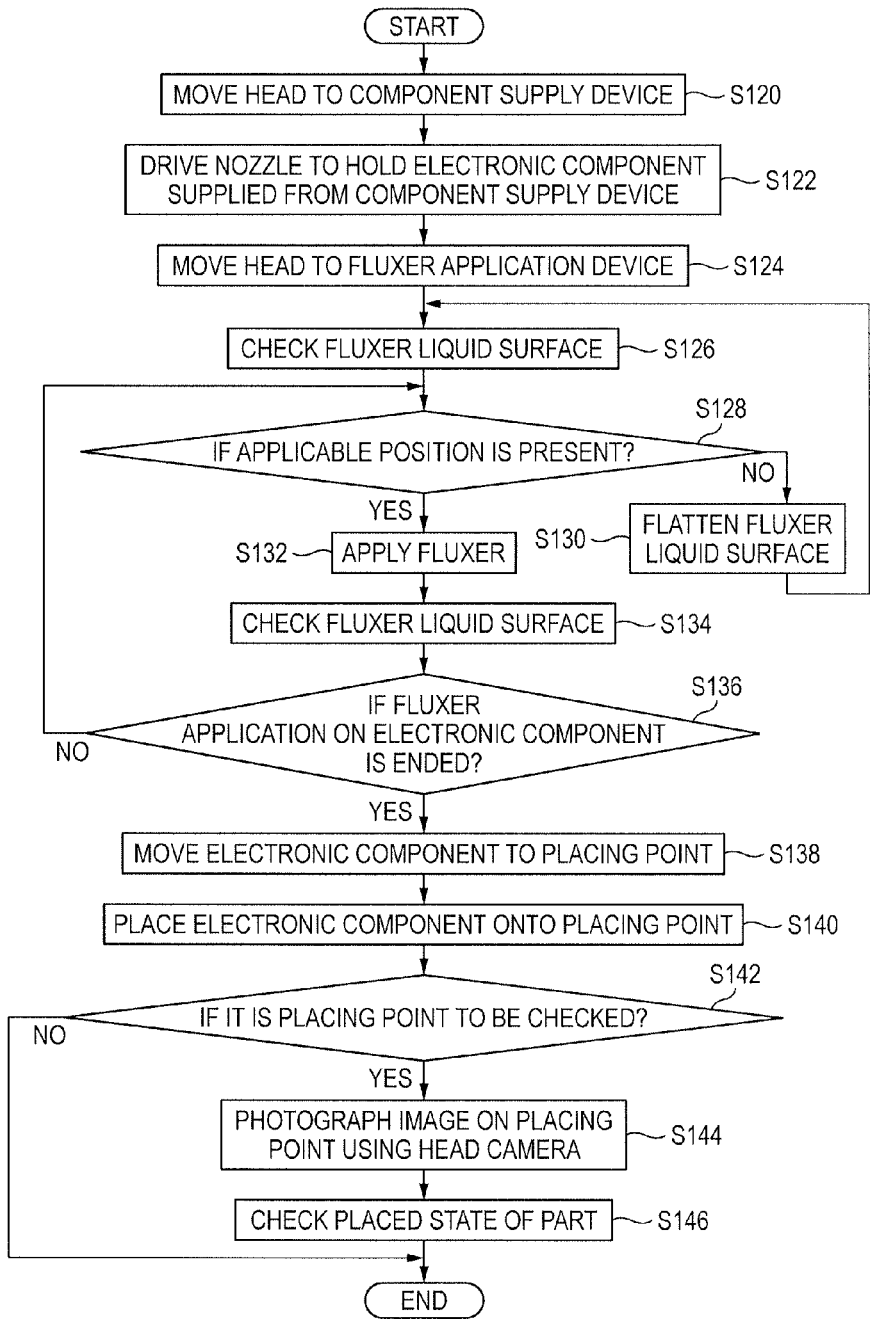
FIG. 14 is a flow chart of an example of the operation of the apparatus.
Figure 15:
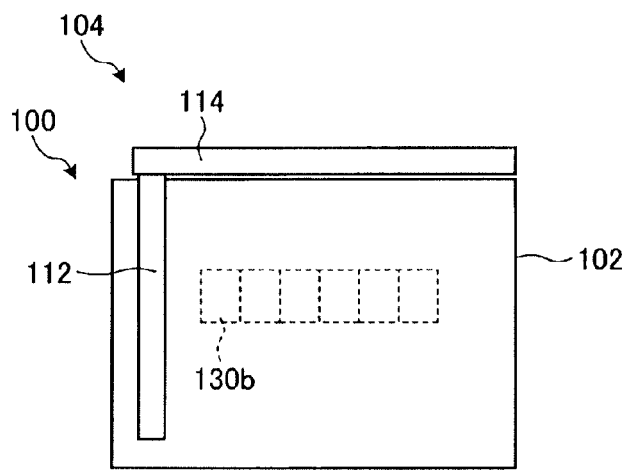
FIG. 15 is an explanatory view of the operation of the apparatus.
Figure 16:
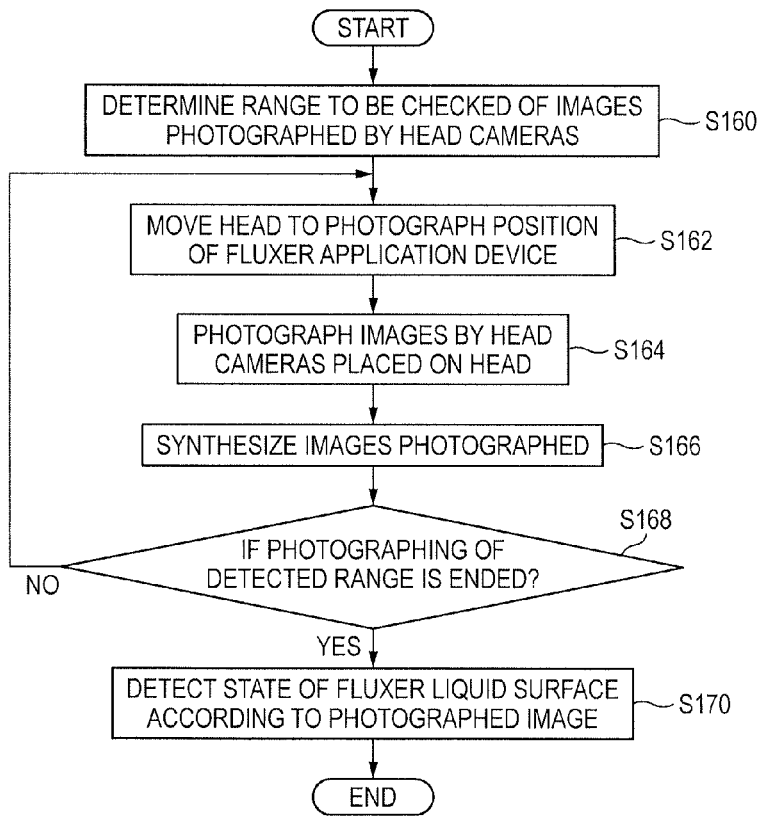
FIG. 16 is a flow chart of an example of the operation of the apparatus.

Next, referring to FIGS. 14 to 16, description is given of another example of the operation of the electronic component mounting apparatus. FIG. 14 is a flow chart of an example of the operation of the apparatus. FIG. 15 is an explanatory view of the operation of the apparatus. FIG. 16 is a flow chart of an example of the operation of the apparatus. FIGS. 14 to 16 show a process to be performed when a fluxer is applied to an electronic component to be mounted onto a substrate. An electronic component to be mounted without applying a fluxer thereto may be mounted according to the above process of FIG. 11.

The control device 20 moves the head to an electronic component supply device holding electronic components to be mounted (Step S120), and drives the nozzles to hold the electronic components to be supplied from the component supply device (Step S122). This sets a state where the electronic components can be transferred by the nozzles.

After then, the control device 20 moves the head to move the head and electronic components to a position opposed to the fluxer application device 100 (Step S124). On moving the head 14 to the position opposed to the fluxer application device 100, the control device 20 performs the fluxer liquid surface check process (Step S126). Specifically, as shown in FIG. 15, it obtains the images of ranges 130b using the head camera unit and checks the state of the fluxer liquid surface (whether the respective positions are flat or uneven) and the like. An example of the process is explained below with reference to FIG. 16.

The control device 20 determines the range to be checked of an image obtained by the head (Step S160). That is, it determines such ranges of images (images obtainable by imaging elements) obtained by the head cameras 52 of the head camera unit 35 as are obtained actually as images to be analyzed. Specifically, as shown in FIG. 15, when the liquid surface of the Fluxer F is photographed, it determines a range 130b to be analyzed. Here, the range 130b is a range which is contacted with the same ranges 130b set also in adjoining head cameras 52. Thus, as shown in FIG. 15, the ranges 130b to be photographed by the multiple head cameras 52 of the head camera unit 35 are set to be linked with each other.

The control device 20, on determining the ranges to be checked, moves the head to the photograph position (Step S162), photographs images using the multiple head cameras mounted on the head (Step S164), and synthesizes images photographed (Step S166). Specifically, it synthesizes the images of six ranges 130b respectively photographed by six head cameras 52. Here, since the ranges 130b are linked with each other, an image obtained by synthesizing the images of the six ranges 130b provides the image of a wide range constituted of the six ranges linked together with no break.

The control device 20, on synthesizing the images, checks whether photographing of the detected ranges is ended or not (Step S168). That is, it checks whether the images of all ranges to be checked for hold positions are photographed or not. When photographing is not ended (No in Step S168), it returns to Step S162, moves to a next photograph position, photographs images, and synthesizes images photographed. In this manner, it obtains the images of the ranges to be checked. Here, it may further synthesize one synthesized image and another synthesized image, or may treat them as individual images.

When photographing is ended (Yes in Step S168), it checks the state of the fluxer liquid surface (Step S170) according to the photographed image and then ends this process. Specifically, it checks the respective positions of the fluxer liquid surface for presence or absence of unevenness.

On checking the state of the fluxer liquid surface, the control device 20 checks whether an applicable position is present or not (Step S128). Here, the "applicable position" means such position of the fluxer liquid surface as is determined not to be uneven, that is, is determined to be flat. When an applicable position is absent (No in Step S128), it performs a flattening treatment on the fluxer liquid surface (Step S130) and then returns to Step S126. The "flattening treatment on the fluxer liquid surface" means a treatment which flattens the liquid surface of the fluxer F using a fluxer flattening mechanism 104. This can reduce or eliminate the unevenness of the fluxer liquid surface, thereby enabling setting of applicable positions on the liquid surface.

When an applicable position is present (Yes in Step S128), it performs a fluxer application process (Step S132). The "fluxer application process" means a process which, after moving an electronic component to an applicable position, lowers the electronic component using a nozzle to bring it into contact with the fluxer liquid surface at the applicable position. Thus, the portion of the electronic component contacted with the fluxer liquid surface is coated with the fluxer.

On applying the fluxer to the electronic component, it performs a check process on the fluxer liquid surface (Step S134) and checks whether fluxer application on the electronic component is completed or not (Step S136). It compares the states of the fluxer liquid surface before and after the fluxer application process according to the result of the check treatment to check the change of the applicable position of the fluxer contacted with the electronic component is executed. When the liquid surface at the position contacted with the electronic component at the applicable position has changed (unevenness has occurred), it determines that the fluxer has been applied to the electronic component. When fluxer application to the electronic component is not completed (No in Step S136), that is, when it determines that the fluxer surface has not changed, it returns to Step S128 and applies the fluxer to the electronic component again.

When fluxer application to the electronic component is completed (Yes in Step S136), it drives the head to move the electronic component held by the nozzle to the placing point (Step S138), and places the electronic component on the placing point (Step S140). In this manner, the fluxer applied electronic component can be mounted onto the substrate. On mounting the electronic component, it checks whether the placing point where the electronic component is placed is a placing point to be checked or not (Step S142). When it is not the placing point to be checked (No in Step S142), it ends this process.

For the placing point to be checked (Yes in Step S142), it drives the head camera to photograph the image of the placing point (Step S144) and checks the placed state of the electronic component (Step S146), thereby ending this process. The control device 20, when obtaining the image of the placing point after placing the electronic component, may drive only the head camera corresponding to the nozzle with the electronic component placed thereon to photograph an image, or may drive the multiple head cameras to photograph images. On obtaining the image of the placing point after placing the electronic component, it checks whether the electronic component is placed properly or not.

The apparatus 10 checks the liquid surface of the fluxer of the fluxer application position and, according to the check result, determines a position where the electronic component is contacted with the liquid surface of the fluxer, thereby being able to bring the electronic component into contact with the flat portion of the fluxer liquid surface. Thus, the fluxer can be applied to the electronic component more positively. Also, by checking the fluxer liquid surface of the fluxer application device to find the flat portion, even when a flattening treatment is not performed on the fluxer liquid surface, the fluxer can be applied to the electronic component properly. This can reduce the frequency of the fluxer flattening treatment (can prevent execution of an unnecessary flattening treatment) and enables application of the fluxer to the electronic component with high probability. Thus, the time necessary for the fluxer flattening treatment can be shortened and an electronic component with no fluxer attached thereto can be prevented from being mounted on the substrate. This can enhance the productivity and yield of the apparatus.

Also, by detecting and comparing the images before and after the fluxer is applied to the electronic component, the apparatus 10 can check from comparison of the images whether the fluxer could be applied to the electronic component or not. This can prevent an electronic component with no fluxer applied or with fluxer applied insufficiently from being placed onto a substrate, which also can enhance the yield.

Also, the apparatus 10 executes a flattening treatment according to the checked result of the fluxer liquid surface.

However, without executing the flattening treatment, it may notify a user that the fluxer is in an un-applicable state.

When checking the liquid surface of the fluxer as well, by synthesizing images photographed by the multiple head cameras 52 of the head camera unit 35, the apparatus 10 can obtain the image of a wide range and thus can carry out the processes with high efficiency. Also, by using images photographed by the head cameras 52, the hold positions can be photographed from obliquely. This enables high-precision detection of the solid shape of the fluxer liquid surface. Here, preferably, as in this embodiment, by synthesizing images photographed by the multiple head cameras 52 of the head camera unit 35, the liquid surface of the fluxer may be checked. However, the liquid surface may also be checked using the imaging device 36.

In this invention, an electronic component mounting apparatus includes a substrate transfer unit, an electronic component supply device, a head, a head moving mechanism, a control device and a fluxer application device. The substrate transfer unit, the electronic component supply device, the head, the head moving mechanism, the control device and the fluxer application device are each implemented via at least one processor.

What is claimed is:

1. An electronic component mounting apparatus, comprising:
    a substrate transfer unit that transfers a substrate, the substrate having a plurality of unit substrates;
    an electronic component supply device that supplies an electronic component;
    a head that includes a head main body and a head camera unit,
        wherein the head main body includes:
            a plurality of nozzles that hold electronic components and that are arranged in a row;
            a nozzle drive unit that drives the nozzles; and
            a head support body that supports the nozzles and the nozzle drive unit,
        wherein the head camera unit are fixed to the head support body and has a plurality of head cameras corresponding to the nozzles respectively for photographing electronic components held by the corresponding nozzles or electronic components to be held by the corresponding nozzles,
        wherein the head drives the nozzles to hold the electronic components, transfers the electronic components from the electronic component supply device to the substrate and mounts the electronic components onto the substrate,
    a head moving mechanism that moves the head;
    a control device that includes a camera control unit which processes images photographed by the head cameras and a head control unit which controls an operation of the head, and
    an imaging device that is fixed to the head main body and that photographs an area opposed to the head,
    wherein the camera control unit synthesizes the images photographed by the head cameras to generate an image with fields of the head cameras connected together,
    wherein the control device determines a process based on the image synthesized by the camera control unit,
    wherein the control device drives the imaging device to photograph the substrate to detect a position of a reference mark, the reference mark being formed on a surface of the substrate and configured to assist in deposing the electronic component on the substrate,
    wherein the control device specifies a bad mark forming position based on the position of the reference mark, photographs a range including the bad mark forming position by the head camera unit, and checks whether a bad mark is present within the range including the bad mark forming position based on the synthesized image,
    wherein the bad mark is formed on a surface of at least one unit substrate of the plurality of unit substrates, and the bad mark indicating that the at least one unit substrate of the plurality of unit substrates is to be omitted from having electronic components mounted thereon, and
    wherein each unit substrate including the bad mark photographed within the range including the bad mark forming position is omitted from unit substrates for mounting electronic component thereon.

2. The electronic component mounting apparatus according to claim 1,
    wherein the control device controls a mounting of the electronic component based on a mounting point of the electronic component included in the synthesized image.

3. The electronic component mounting apparatus according to claim 2,
    wherein the control device drives the head camera unit to photograph a range including the mounting point where the electronic component is mounted, and
    the control device compares images photographed before and after the electronic component is mounted, and controls an electronic component mounting operation based on a comparison result.

4. The electronic component mounting apparatus according to claim 1,
    wherein the control device drives the head camera unit to photograph the electronic component supply device,
    the control device detects a hold position for holding the electronic component based on the synthesized image, and
    the hold position of the electronic supply device is a position where the component supply device holds an electronic component.

5. The electronic component mounting apparatus according to claim 1, further comprising:
    a fluxer application device that has a fluxer storage unit which stores a fluxer therein and that applies the fluxer to the electronic component by using the nozzle so as to have a contact between the electronic component and the fluxer,
    wherein the control device drives the head camera unit to photograph a liquid surface of the fluxer stored in the fluxer storage unit, and
    the control device controls an operation to apply the fluxer to the electronic component based on the synthesized image.

6. The electronic component mounting apparatus according to claim 5,
    wherein the control device detects the liquid surface of the fluxer based on the synthesized image to determine a position of the fluxer liquid surface with which the electronic component is to be contacted.

7. The electronic component mounting apparatus according to claim 5,
    wherein the control device detects the liquid surface of the fluxer based on the synthesized image, and when the liquid surface has no area capable of applying the fluxer to the electronic component, the control device stops the operation that applies the fluxer to the electronic component.

8. The electronic component mounting apparatus according to claim 5,
  wherein the control device drives the head camera unit to photograph the liquid surface of the fluxer stored in the fluxer storage unit before and after the fluxer is applied to the electronic component, and
  the control device checks the liquid surface of the fluxer based on the synthesized image and determines an applied state of the fluxer to the electronic component based on a change of the liquid surface of the fluxer.

* * * * *